(12) United States Patent
Zhang

(10) Patent No.: US 12,132,047 B2
(45) Date of Patent: Oct. 29, 2024

(54) SEMICONDUCTOR DEVICE AND METHOD FOR MANUFACTURING SEMICONDUCTOR DEVICE

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 383 days.

(21) Appl. No.: 17/647,672

(22) Filed: Jan. 11, 2022

(65) Prior Publication Data
US 2022/0310592 A1    Sep. 29, 2022

Related U.S. Application Data

(63) Continuation of application No. PCT/CN2021/110887, filed on Aug. 5, 2021.

(30) Foreign Application Priority Data

Mar. 29, 2021   (CN) .......................... 202110332468.0

(51) Int. Cl.
*H01L 27/088*   (2006.01)
*H01L 21/822*   (2006.01)
(Continued)

(52) U.S. Cl.
CPC ........ *H01L 27/088* (2013.01); *H01L 21/8221* (2013.01); *H01L 21/823828* (2013.01);
(Continued)

(58) Field of Classification Search
CPC . H01L 27/0688; H01L 27/088; H01L 27/092; H01L 21/8221; H01L 21/823487;
(Continued)

(56) References Cited

U.S. PATENT DOCUMENTS 7,683,428 B2 * 3/2010 Chidambarrao .. H01L 29/66787
438/254
10,418,484 B1 * 9/2019 Xie .................. H01L 21/823475
(Continued)

FOREIGN PATENT DOCUMENTS

CN        1592969 A       3/2005
CN      101090121 A      12/2007
(Continued)

OTHER PUBLICATIONS

International Search Report cited in PCT/CN2021/110887, mailed Jan. 5, 2022, 10 pages.

(Continued)

*Primary Examiner* — Michael M Trinh
(74) *Attorney, Agent, or Firm* — Kilpatrick Townsend & Stockton LLP

(57) ABSTRACT

The present disclosure provides a semiconductor device and a method for manufacturing a semiconductor device. Every two first wires of a first conductive layer of the semiconductor device have a common end, and every two second wires of a second conductive layer of the semiconductor device have a common end.

20 Claims, 20 Drawing Sheets

(51) Int. Cl.
    *H01L 21/8238*     (2006.01)
    *H01L 27/06*     (2006.01)
    *H01L 27/092*     (2006.01)
    *H01L 29/417*     (2006.01)
    *H01L 29/66*     (2006.01)
    *H01L 29/78*     (2006.01)
    *H01L 21/8234*     (2006.01)

(52) U.S. Cl.
    CPC ............. *H01L 21/823871* (2013.01); *H01L 21/823885* (2013.01); *H01L 27/0688* (2013.01); *H01L 27/092* (2013.01); *H01L 29/41741* (2013.01); *H01L 29/66666* (2013.01); *H01L 29/7827* (2013.01); *H01L 21/823475* (2013.01); *H01L 21/823487* (2013.01)

(58) Field of Classification Search
    CPC ..... H01L 21/823885; H01L 21/823828; H01L 21/823475; H01L 21/823871; H01L 29/66666; H01L 29/7827; H01L 29/41741
    See application file for complete search history.

(56) References Cited

U.S. PATENT DOCUMENTS

| | | | |
|---|---|---|---|
| 2007/0290232 A1* | 12/2007 | Nishiyama | H10B 99/00 257/E27.081 |
| 2015/0364486 A1 | 12/2015 | Koval | |
| 2018/0090387 A1 | 3/2018 | Jacob | |
| 2019/0378854 A1 | 12/2019 | Lee et al. | |
| 2020/0203343 A1 | 6/2020 | Zhu et al. | |
| 2020/0212226 A1 | 7/2020 | Reznicek et al. | |
| 2020/0335581 A1 | 10/2020 | Li et al. | |
| 2022/0310597 A1* | 9/2022 | Zhang | H01L 21/8221 |
| 2023/0207463 A1* | 6/2023 | Zhang | H01L 23/5226 257/734 |

FOREIGN PATENT DOCUMENTS

| | | |
|---|---|---|
| CN | 105895635 A | 8/2016 |
| CN | 106252352 A | 12/2016 |
| CN | 106298792 A | 1/2017 |
| CN | 106449596 A | 2/2017 |
| CN | 109196584 A | 1/2019 |
| CN | 109449158 A | 3/2019 |
| CN | 109830483 A | 5/2019 |
| CN | 109841675 A | 6/2019 |
| CN | 110808247 A | 2/2020 |
| CN | 111883534 A | 11/2020 |
| CN | 112309860 A | 2/2021 |
| CN | 112310042 A | 2/2021 |
| CN | 113078154 A | 7/2021 |
| CN | 113078155 A | 7/2021 |
| CN | 113078156 A | 7/2021 |
| JP | 2007059680 A | 3/2007 |
| JP | 2007250652 A | 9/2007 |

OTHER PUBLICATIONS

"Will CFET be the Transistor of Choice for the Future?", Semiconductor Industry Observation, May 28, 2020, 25 pages.

* cited by examiner

SEMICONDUCTOR DEVICE AND METHOD FOR MANUFACTURING SEMICONDUCTOR DEVICE

CROSS-REFERENCE TO RELATED APPLICATION

The present disclosure is a continuation of International Patent Application No. PCT/CN2021/110887, filed on Aug. 5, 2021, which claims the priority of Chinese Patent Application No. 202110332468.0, filed on Mar. 29, 2021 and entitled "Semiconductor Device and Method for Manufacturing Semiconductor Device". International Patent Application No. PCT/CN2021/110887 and Chinese Patent Application No. 202110332468.0 are incorporated herein by reference in their entireties.

TECHNICAL FIELD

The present disclosure relates to, but is not limited to, a semiconductor device and a method for manufacturing a semiconductor device.

BACKGROUND

As semiconductor industry enters a nanotechnology process node in the process of pursuing higher device density, higher performance and lower cost, challenges from manufacturing and design issues have led to development of three-dimensional design such as a multi-gate field effect transistor (FET). A gate-all-around complementary field effect transistor (CFET) is to stack, in a vertical direction, cylindrical nanowires or nanoribbon channels of an N-channel metal oxide semiconductor field effect transistor (NFET) and a P-channel metal oxide semiconductor field effect transistor (PFET). Chip area is greatly reduced while driving current of a chip device is increased, and integration degree of the chip device is improved.

In the gate-all-around complementary field effect transistor, all sides of a channel region are surrounded by a gate electrode, which allows for more sufficient depletion in the channel region; and due to a steeper current subthreshold swing (SS) and less drain-induced barrier lowering (DIBL), less short-channel effect is generated.

Along with a technology node in which size of a transistor continues to be reduced to below 10-15 nm, the gate-all-around complementary field effect transistor needs to be further improved.

SUMMARY

Some embodiments of the present disclosure provide a semiconductor device, including: a substrate; a first conductive layer, provided on a surface of the substrate, the first conductive layer including a plurality of first wire pairs, each of the plurality of first wire pairs including two parallel first wires, and the two parallel first wires having a common end and a non-common end; a first field effect transistor, provided on the first conductive layer and having first channel structures, the first channel structures extending in a direction perpendicular to the surface of the substrate, and a first end of each of the first channel structures being electrically connected to the first wire; a second conductive layer, provided on the first field effect transistor, the second conductive layer including a plurality of second wire pairs, each of the plurality of second wire pairs including two parallel second wires, and the two parallel second wires having a common end and a non-common end; a second field effect transistor, provided on the second conductive layer and having second channel structures, the second channel structures extending in the direction perpendicular to the surface of the substrate, and a first end of each of the second channel structures and a second end of each of the first channel structures are electrically connected to the second wire respectively; and a gate structure, surrounding sides of the first channel structures and sides of the second channel structures, and the first field effect transistor and the second field effect transistor sharing the gate structure.

Some embodiments of the present disclosure further provide a method for manufacturing a semiconductor device, the semiconductor device including at least a conductive layer, the conductive layer including a plurality of wire pairs, each of the plurality of wire pairs including two parallel wires, and the two parallel wires having a common end and a non-common end; and a method for forming the conductive layer includes: an initial conductive layer is formed on a substrate; the initial conductive layer is patterned to form a plurality of initial wire pairs, each of the plurality of initial wire pairs being a closed pattern enclosed by the two parallel wires; and one end of each of the plurality of initial wire pairs is cut, so as to disconnect each of the plurality of initial wire pairs from the end, so that the two parallel wires have the common end and the non-common end.

BRIEF DESCRIPTION OF THE DRAWINGS

In order to illustrate the technical solutions of embodiments of the present disclosure more clearly, hereinafter, accompanying drawings requiring to be used in the embodiments of the present disclosure will be briefly introduced. Apparently, the accompanying drawings in the following description merely relate to some embodiments of the present disclosure, and for a person of ordinary skill in the art, other accompanying drawings can also be manufactured according to these accompanying drawings without involving any inventive effort.

DETAILED DESCRIPTION OF THE EMBODIMENTS

It should be understood that the following disclosure provides many different embodiments or examples for implementing different features of some embodiments of the present disclosure. Hereinafter, specific embodiments or examples of assemblies and arrangements are described to simplify some embodiments of the present disclosure. Of course, these are merely examples and are not intended to limit some embodiments of the present disclosure. For example, dimensions of elements are not limited to the disclosed ranges or values, but can depend on process conditions and/or desired characteristics of a device. In addition, in the following description, forming a first component above or on a second component can include an embodiment in which the first component and the second component are formed in a direct contact manner, and can also include an embodiment in which additional components can be formed between the first component and the second component, so as to form embodiments in which the first component and the second component do not contact directly. For purposes of simplicity and clarity, the various components can be arbitrarily drawn at different scales.

Also, for ease of description, spatial relative terms, such as "beneath . . . ", "below . . . ", "lower", "above . . . ", "upper" and the like, can be used herein to describe the relationship between one element or component and another element(s) or component(s) as shown in the figures. In addition to the orientations shown in the figures, the spatial relative terms are intended to include different orientations of a device in use or operation. The device can be otherwise oriented (rotated by 90 degrees or in other orientations), and the spatial relative descriptors used herein may likewise be interpreted accordingly. In addition, the term "made of . . . " may represent "including" or "consisting of . . . ".

Hereinafter, embodiments of a semiconductor device and a method for manufacturing a semiconductor device provided in the present disclosure will be described in detail with reference to the accompanying drawings.

Figure 1A:
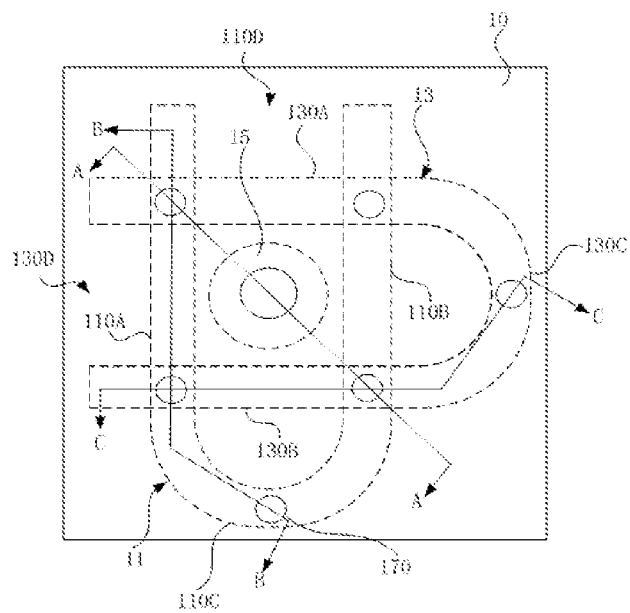
FIG. 1A is a schematic top view of the structure of a semiconductor device in a first embodiment of the present disclosure.
Figure 1B:
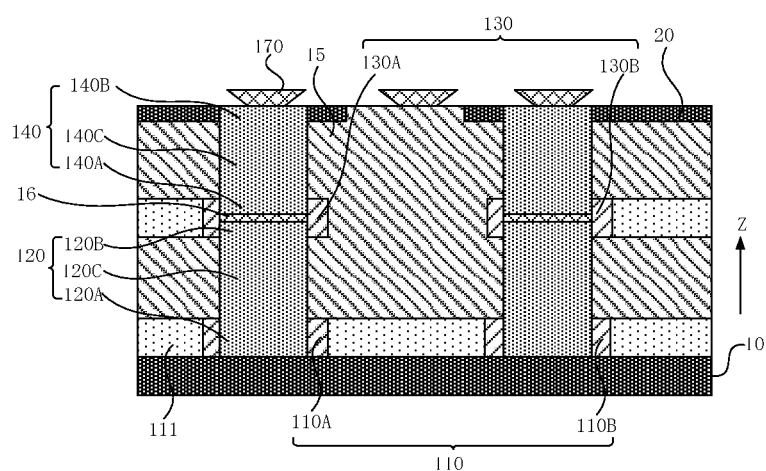
FIG. 1B is a schematic cross-sectional view taken along line A-A of FIG. 1A.
Figure 1C:
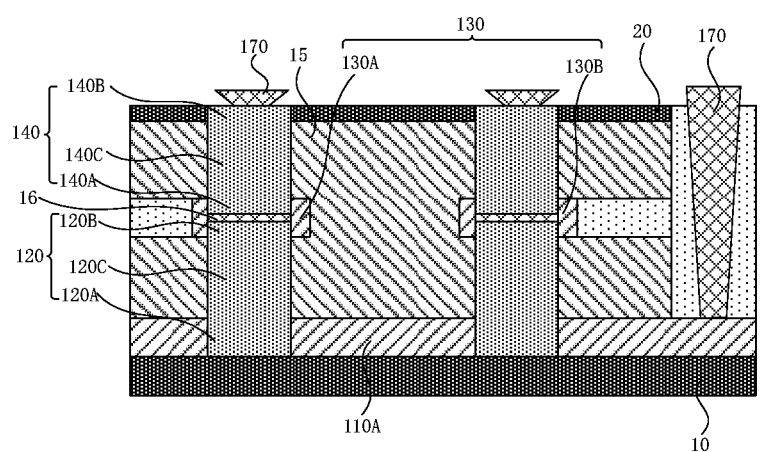
FIG. 1C is a schematic cross-sectional view taken along line B-B of FIG. 1A.
Figure 1D:
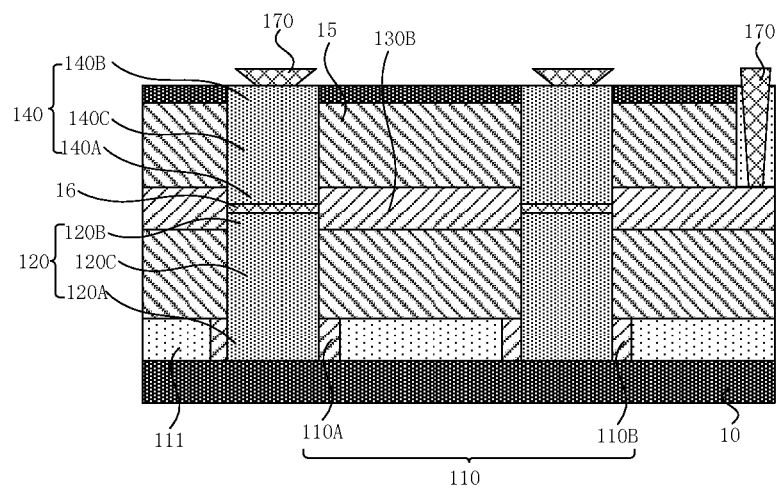
FIG. 1D is a schematic cross-sectional view taken along line C-C of FIG. 1A.

FIG. 1A is a schematic top view of a structure of a semiconductor device in a first embodiment of the present disclosure; FIG. 1B is a schematic cross-sectional view taken along line A-A of FIG. 1A; FIG. 1C is a schematic cross-sectional view taken along line B-B of FIG. 1A; and FIG. 1D is a schematic cross-sectional view taken along line C-C of FIG. 1A. Please refer to FIGS. 1A-1D, the semiconductor device includes a substrate 10, a first conductive layer 11, a first field effect transistor, a second conductive layer 13, a second field effect transistor and a gate structure 15.

Material of the substrate 10 can be monocrystalline silicon (Si), monocrystalline germanium (Ge), or silicon germanium (GeSi), silicon carbide (SiC); the material can also be silicon on insulator (SOI), germanium on insulator (GOI); or the material can also be other material, for example, III-V compounds such as gallium arsenide. In the present embodiment, the material of the substrate 10 is monocrystalline silicon (Si).

The first conductive layer 11 is provided on a surface of the substrate 10. That is to say, in a Z direction in FIG. 1B, the first conductive layer 11 is provided on the surface of the substrate. As the first conductive layer 11 is shielded, in order to clearly show the structure of the semiconductor device in some embodiments of the present disclosure, the first conductive layer 11 is schematically drawn by dotted lines in FIG. 1A.

Figure 2A:
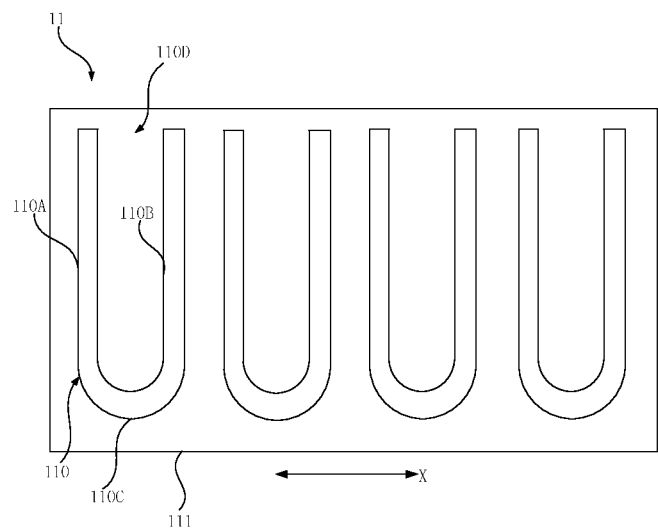
FIGS. 2A-2C are schematic top views of a first conductive layer provided in the first embodiment of the present disclosure.

FIG. 2A is a schematic top view of the first conductive layer 11 provided in some embodiments of the present disclosure. Please refer to FIG. 2A, the first conductive layer 11 includes a plurality of first wire pairs 110. Only four first wire pairs 110 are schematically drawn in FIG. 2A. It can be understood that the semiconductor device can include more than four first wire pairs. In some embodiments, the first conductive layer 11 further includes a first dielectric layer 111, the plurality of first wire pairs 110 are provided in the first dielectric layer 111, and the first dielectric layer 111 supports the plurality of first wire pairs 110.

Each of the plurality of first wire pairs 110 includes two parallel first wires 110A and 110B, and the two parallel first wires 110A and 110B have a common end 110C and a non-common end 110D. The common end 110C refers to an end where the two parallel first wires 110A and 110B are connected, and the non-common end 110D refers to an end where the two parallel first wires 110A and 110B are disconnected. For the plurality of first wire pairs 110 in such a form, only one connecting wire needs to be used at the common end to electrically lead out the two first wires, and therefore, not only a process window can be increased, but also one connecting wire can be omitted, providing convenience for wire connecting processes of subsequent sections.

In some embodiments of the present disclosure, each of the plurality of first wire pairs 110 is formed by cutting one end of a closed pattern enclosed by the two parallel first wires 110A and 110B, and not cutting the other end of the closed pattern enclosed by the two parallel first wires 110A and 110B, which provides the convenience for the wire connecting processes of the subsequent sections without increasing process complexity.

Common ends of the plurality of first wire pairs 110 can be located on a same side of the substrate 10, and can also be located on different sides of the substrate 10. As shown in FIG. 2A, in this embodiment, the common ends 110C of the plurality of first wire pairs 110 are located on the same side of the substrate 10, and non-common ends 110D thereof are located on an other side of the substrate 10.

However, in some other embodiments of the present disclosure, the common ends of the plurality of first wire pairs 110 are located on the different sides of the substrate 10; and in the first conductive layer 11, the common end 110C and the non-common end 110D of the plurality of first wire pairs 110 are alternately provided in a direction perpendicular to a direction of a length of the first wires 110A and 110B. An alternating arrangement can be an alternating arrangement by the common end 110C of the first wire pair 110 and the non-common end 110D of an adjacent first wire pair 110 as a unit interval, and can also be an alternating arrangement by the common ends 110C of the plurality of first wire pairs 110 and the non-common ends 110D of the plurality of first wire pairs 110 as the unit interval.

Figure 2B:
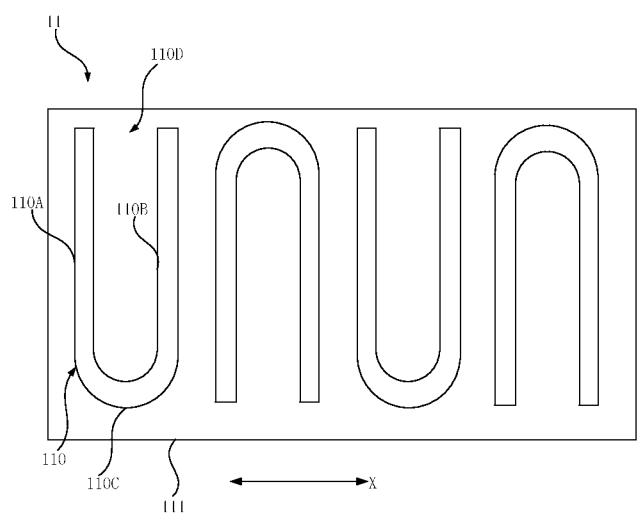

For example, in the embodiment as shown in FIG. 2B, in the direction perpendicular to the direction of the length of the first wires 110A and 110B (for example, an X direction in FIG. 2B), the common ends 110C and the non-common ends 110D of the four first wire pairs 110 are alternately provided by the common end 110C of one first wire pair 110 and the non-common end 110D of another first wire pair 110 as the unit interval.

Figure 2C:
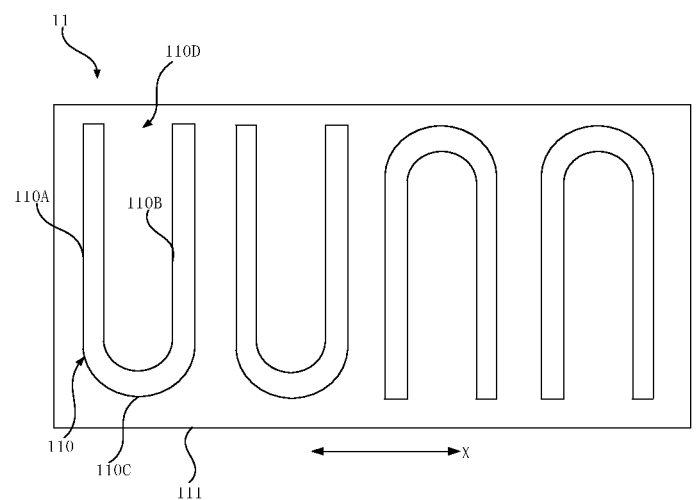

For example, in the embodiment as shown in FIG. 2C, in the direction perpendicular to the direction of the length of the first wires 110A and 110B (for example, an X direction in FIG. 2C), the common ends 110C and the non-common ends 110D of the four first wire pairs 110 are alternately provided by the common ends 110C of two first wire pairs 110 and the non-common ends 110D of another two first wire pairs 110 as the unit interval.

Please continue to refer to FIGS. 1A-1D, the first field effect transistor is provided on the first conductive layer 11. That is to say, in the Z direction in FIG. 1B, the first field effect transistor is provided on the first conductive layer 11.

The first field effect transistor has first channel structures 120. The first channel structures 120 extend in a direction perpendicular to the surface of the substrate 10 (the Z direction in FIG. 1B). A first end 120A of each of the first channel structures 120 is electrically connected to each of the first wires 110A and 110B. The first end 120A at which each of the first channel structures 120 is electrically connected to the first wires 110A and 110B is a source region of the first field effect transistor.

Figure 3:
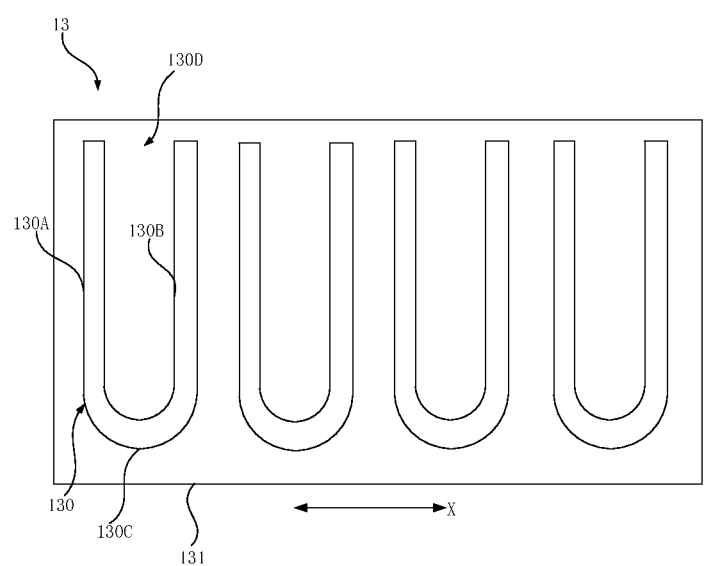
FIG. 3 is a schematic top view of a second conductive layer provided in the first embodiment of the present disclosure.

The second conductive layer 13 is provided on the first field effect transistor. That is to say, in the Z direction in FIG. 1B, the second conductive layer 13 is provided on the first field effect transistor. As the second conductive layer 13 is shielded, in order to clearly show the structure of the semiconductor device in some embodiments of the present disclosure, the second conductive layer 13 is schematically drawn by dotted lines in FIG. 1A. FIG. 3 is a schematic top view of the second conductive layer 13 provided in the first embodiment of the present disclosure. Please refer to FIG. 3, the second conductive layer 13 includes a plurality of second wire pairs 130. Only four second wire pairs 130 are schematically drawn in FIG. 3. It can be understood that the semiconductor device can include more than four second wire pairs. In some embodiments, the second conductive layer 13 further includes a second dielectric layer 131, the plurality of second wire pairs 130 are provided in the second dielectric layer 131, and the second dielectric layer 131 supports the plurality of second wire pairs 130.

Each of the plurality of second wire pairs 130 includes two parallel second wires 130A and 130B, and the two parallel second wires 130A and 130B have a common end 130C and a non-common end 130D. The common end 130C refers to an end where the two parallel second wires 130A and 130B are connected, and the non-common end 130D refers to an end where the two parallel second wires 130A and 130B are disconnected. For the plurality of second wire pairs 130 in such a form, only one connecting wire needs to be used at the common end to electrically lead out the two second wires, which not only can increase the process window, but also can omit one connecting wire, providing the convenience for the wire connecting processes of the subsequent sections.

In some embodiments of the present disclosure, each of the plurality of second wire pairs 130 is formed by cutting one end of a closed pattern enclosed by the two parallel second wires 130A and 130B, and not cutting the other end of the closed pattern enclosed by the two parallel second wires 130A and 130B, which provides the convenience for the wire connecting processes of the subsequent sections without increasing the process complexity.

Common ends of the plurality of second wire pairs 130 can be located on a same side of the substrate 10, and can also be located on different sides of the substrate 10. As shown in FIG. 3, in this embodiment, the common ends 130C of the plurality of second wire pairs 130 are located on the same side of the substrate 10, and non-common ends 130D thereof are located on an other side of the substrate 10.

However, in some other embodiments of the present disclosure, the common ends of the plurality of second wire pairs 130 are located on the different sides of the substrate 10; and in the second conductive layer 13, the common ends 130C and the non-common ends 130D of the plurality of second wire pairs 130 are alternately provided in a direction perpendicular to a direction of a length of the second wires 130A and 130B. For specific arrangement, reference can be made to FIGS. 2B and 2C, and details will not be repeated herein.

Figure 4:
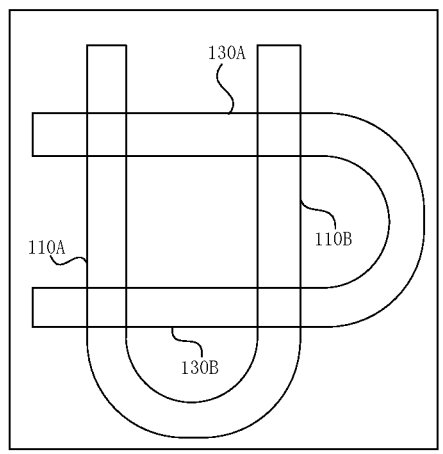
FIG. 4 is a schematic diagram of projections of first wires and second wires on a surface of a substrate provided in the first embodiment of the present disclosure.
Figure 5:
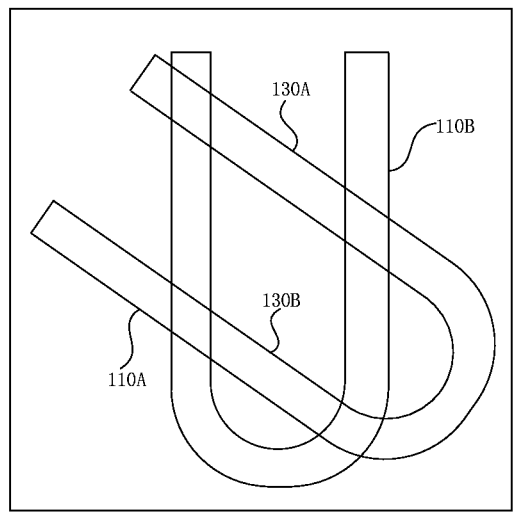
FIG. 5 is a schematic diagram of other projections of first wires and second wires on the surface of the substrate provided in the first embodiment of the present disclosure.

In some embodiments, in the direction perpendicular to the surface of the substrate 10, a projection of the first wire on the surface of the substrate and a projection of the second wire on the surface of the substrate intersect with one another. Specifically, FIG. 4 is a schematic diagram of projections of the first wires 110A, 110B and the second wires 130A, 130B on the surface of the substrate 10. Please refer to FIG. 4, in the direction perpendicular to the surface of the substrate 10 (the Z direction in FIG. 1B), projections of the first wires 110A, 110B on the surface of the substrate 10 and projections of the second wires 130A, 130B on the surface of the substrate 10 intersect with one another in the perpendicular direction. However, in other embodiments of the present disclosure, please refer to FIG. 5, which is a schematic diagram of other projections of the first wires 110A, 110B on the surface of the substrate 10 and the second wires 130A, 130B on the substrate 10. In the direction perpendicular to the surface of the substrate 10 (the Z direction in FIG. 1B), the projections of the first wires 110A, 110B on the surface of the substrate 10 and the projections of the second wires 130A, 130B on the surface of the substrate 10 intersect with one another at an acute angle.

Figure 6:
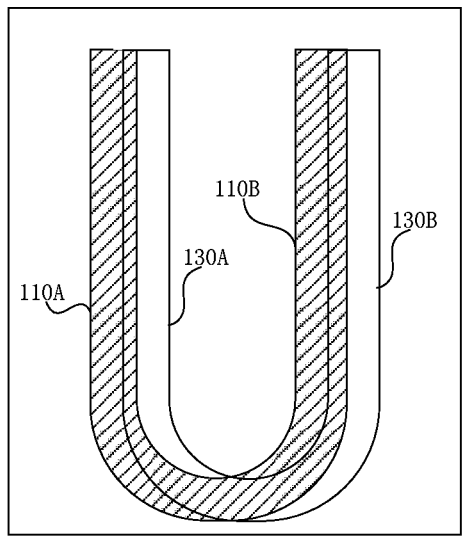
FIG. 6 is a schematic diagram of other projections of first wires and second wires on the surface of the substrate provided in the first embodiment of the present disclosure.

In some embodiments of the present disclosure, in the direction perpendicular to the surface of the substrate 10, the projections of the first wires on the surface of the substrate and the projections of the second wires on the surface of the substrate are parallel and have a set displacement. Specifically, please refer to FIG. 6, which is a schematic diagram of other projections of the first wires 110A, 110B and the second wires 130A, 130B on the substrate 10. In the direction perpendicular to the surface of the substrate 10 (the Z direction in FIG. 6), the projections of the first wires 110A, 110B on the surface of the substrate 10 and the projections of the second wires 130A, 130B on the surface of the substrate 10 are parallel and have the set displacement. That is, in the direction perpendicular to the surface of the substrate 10 (the Z direction in FIG. 1B), the projections of the first wires 110A, 110B on the surface of the substrate 10 and the projection of the second wires 130A, 130B on the surface of the substrate 10 are parallel, but are staggered. For example, in the embodiment as shown in FIG. 6, the projections of the first wires 110A, 110B on the surface of the substrate 10 and the projection of the second wires 130A, 130B on the surface of the substrate 10 are parallel and at least partially overlap; while in some other embodiments, the projections of the first wires 110A, 110B on the surface of the substrate 10 and the projection of the second wires 130A, 130B on the surface of the substrate 10 are parallel and have no overlap regions.

Please continue to refer to FIGS. 1A-1D, the second field effect transistor is provided on the second conductive layer 13. That is to say, in the Z direction in FIG. 1B, the second field effect transistor is provided on the second conductive layer 13.

The second field effect transistor has second channel structures 140. The second channel structures 140 extend in the direction perpendicular to the surface of the substrate 10 (the Z direction in FIG. 1B). A first end 140A of each of the second channel structures 140 and a second end 120B of each of the first channel structures 120 are electrically connected to each of the second wires 130A and 130B respectively.

The second end 120B, electrically connected to each of the second wires 130A and 130B, of each of the first channel structures 120 is a drain region of the first field effect transistor; and a region located between the first end 120A and the second end 120B of each of the first channel structures 120 is a channel region 120C of each of the first channel structures 120. The first end 140A, electrically connected to each of the second wires 130A and 130B, of each of the second channel structures 140 is a drain region of the second field effect transistor; a second end 140B, opposite to the first end 140A, of each of the second channel structures 140 is a source region of the second field effect transistor; and a region located between the first end 140A and the second end 140B of each of the second channel structures 140 is a channel region 140C of each of the second channel structures 140.

In this embodiment, the first channel structures 120 and the second channel structures 140 are stacked in the direction perpendicular to the surface of the substrate 10 (the Z direction in FIG. 1B). The second end 120B of each of the first channel structures 120 extends into each of the second wires 130A, 130B, and the first end 140A of each of the second channel structures 140 extends into each of the second wires 130A, 130B, so to be connected to each of the second wires 130A, 130B. In order to isolate the first channel structures 120 from the second channel structures 140, in the second wires 130A and 130B, a buffer conductive layer 16 is provided between the second end 120B of each of the first channel structures 120 and the first end 140A of each of the second channel structures 140. The buffer conductive layer 16 should not be too thick, and a height of the buffer conductive layer in each of the second wires 130A and 130B is less than or equal to one third of a thickness of each of the second wires 130A and 130B.

The gate structure 15 surrounds sides of the first channel structures 120 and sides of the second channel structures 140. Specifically, the gate structure 15 surrounds sides of channel regions 120C of the first channel structures 120 and sides of channel regions 140C of the second channel structures 140. The first field effect transistor and the second field effect transistor share the gate structure 15. The gate structure 15 includes a gate dielectric layer and a gate conductive layer, and the gate dielectric layer at least covers the sides of the channel regions 120C of the first channel structures 120 and the sides of the channel regions 140C of the second channel structures 140, and the gate conductive layer surrounds the sides of the channel regions 120C of the first channel structures 120 and the sides of the channel regions 140C of the second channel structures 140.

In some embodiments, the first field effect transistor is a P-type field effect transistor, and the second field effect transistor is an N-type field effect transistor; or the first field effect transistor is an N-type field effect transistor, and the second field effect transistor is a P-type field effect transistor, so as to form a vertical-channel CFET structure.

In some embodiments, each of the first wires 110A, 110B and each of the second wires 130A, 130B can be composite structures of an insulation layer and a conductive layer respectively. For example, each of the first wires 110A, 110B and each of the second wires 130A, 130B include an upper insulation layer, a lower insulation layer, and a conductive layer provided between the upper insulation layer and the lower insulation layer.

Please continue to refer to FIGS. 1A-1D, in this embodiment, the semiconductor device further includes a lead wire group, the lead wire group includes a plurality of lead wires 170, the plurality of lead wires 170 are electrically connected to the first wires 110A, 110B, the second wires 130A, 130B, the second channel structures 140 and the gate structure 15. The lead wire group is configured to electrically lead out various structures, so as to be electrically connected to external components.

In some embodiments, the semiconductor device further includes a protective layer 20, the protective layer 20 is provided on the second field effect transistor and covers the gate structure 15. That is to say, in the Z direction in FIG. 1B, the protective layer 20 is provided on the second field effect transistor 140 and covers the gate structure 15.

Figure 7A:
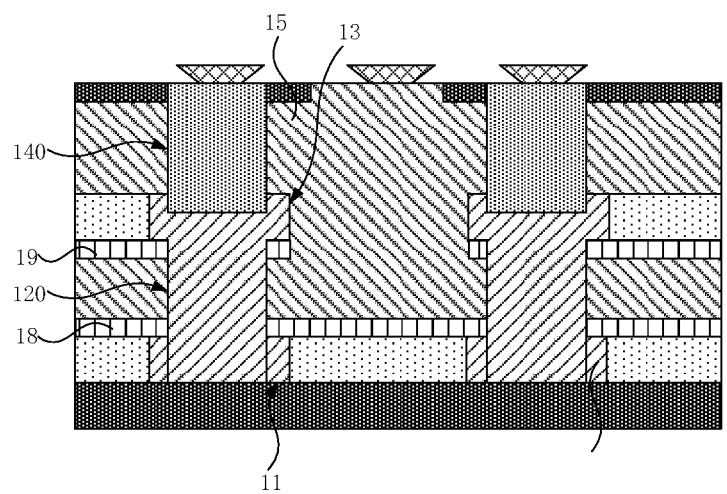
FIG. 7A is a schematic cross-sectional view taken along line A-A of FIG. 1A of a semiconductor device provided in a second embodiment of the present disclosure.
Figure 7B:
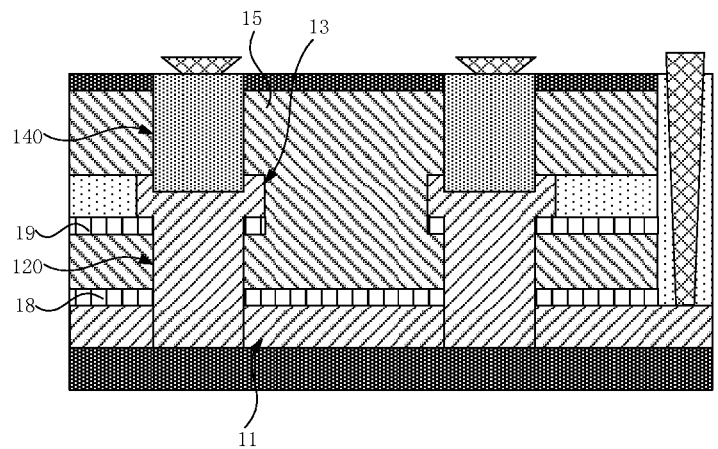
FIG. 7B is a schematic cross-sectional view taken along line B-B of FIG. 1A of the semiconductor device provided in the second embodiment of the present disclosure.
Figure 7C:
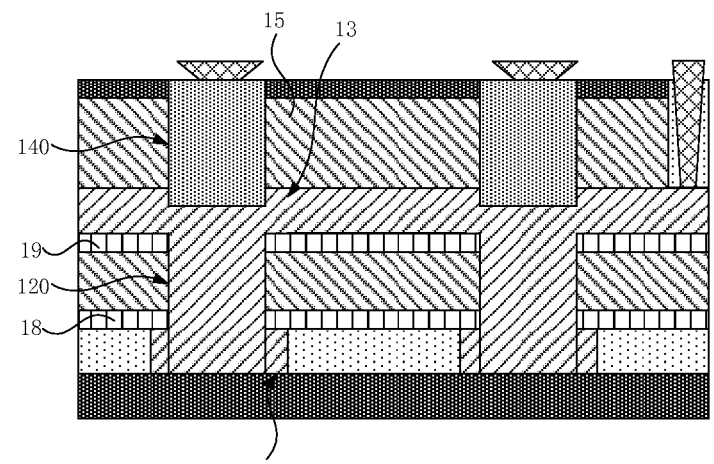
FIG. 7C is a schematic cross-sectional view taken along line C-C of FIG. 1A of the semiconductor device provided in the second embodiment of the present disclosure.

A second embodiment of the present disclosure further provides a semiconductor device. Please refer to FIGS. 7A-7C, in which please refer to FIG. 1A for a schematic top view of the structure of the semiconductor device provided in the second embodiment of the present disclosure; FIG. 7A is a schematic cross-sectional view taken along line A-A of FIG. 1A; FIG. 7B is a schematic cross-sectional view taken along line B-B of FIG. 1A; and FIG. 7C is a schematic cross-sectional view taken along line C-C of FIG. 1A. The second embodiment differs from the first embodiment in that: in the second embodiment, the semiconductor device further includes a first isolation layer 18 and a second isolation layer 19. The first isolation layer 18 is provided between the first conductive layer 11 and the gate structure 15, and the first channel structures 120 penetrate through the first isolation layer 18. The second isolation layer 19 is provided between the gate structure 15 and the second conductive layer 13, and the first channel structures 120 penetrate through the second isolation layer 19. In the second embodiment, the first channel structures 120 and the second wires are formed by an epitaxial process.

Figure 8A:
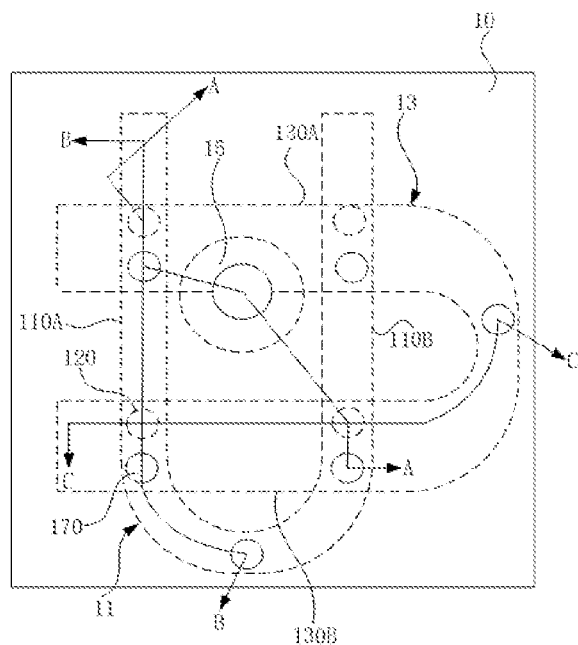
FIG. 8A is a schematic top view of the structure of a semiconductor device provided in a third embodiment of the present disclosure.
Figure 8B:
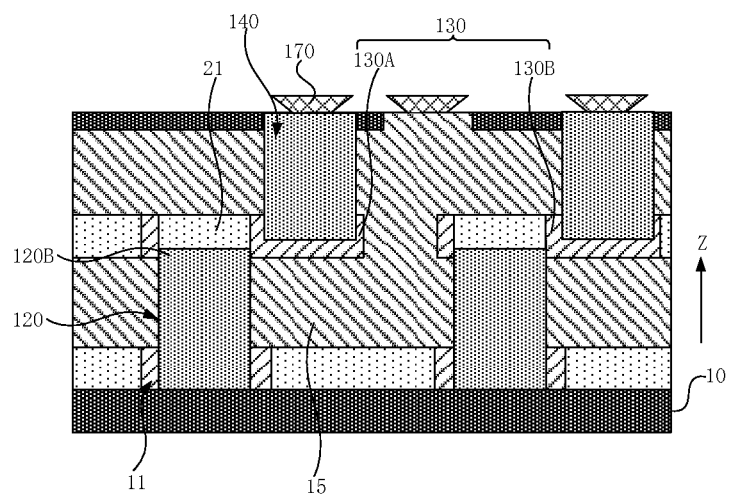
FIG. 8B is a schematic cross-sectional view taken along line A-A of FIG. 8A.
Figure 8C:
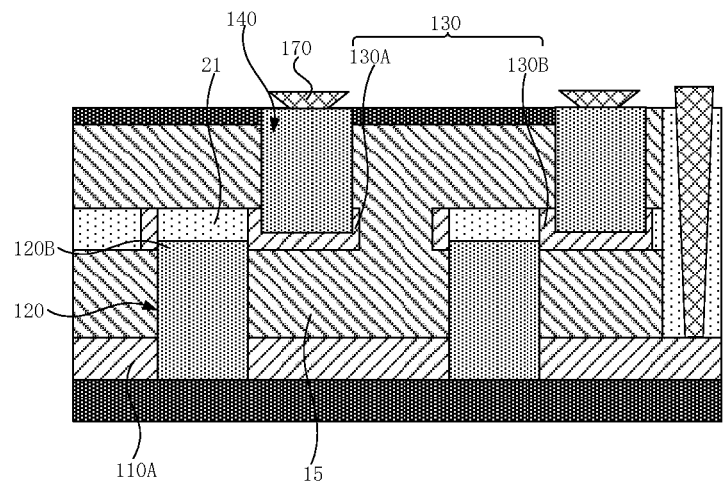
FIG. 8C is a schematic cross-sectional view taken along line B-B of FIG. 8A.
Figure 8D:
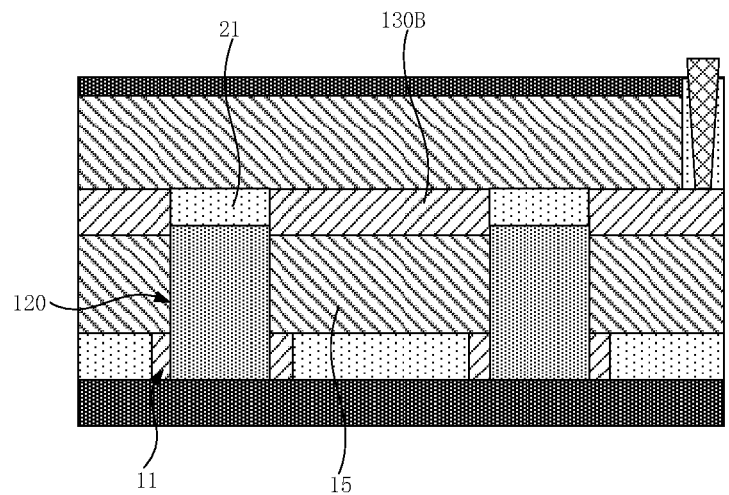
FIG. 8D is a schematic cross-sectional view taken along line C-C of FIG. 8A.

In the first embodiment, in the direction perpendicular to the surface of the substrate 10, the first channel structures 120 and the second channel structures 140 are stacked, and the first channel structures 120 are isolated from the second channel structures 140 through buffer conductive layers 16. However, in some other embodiments of the present disclosure, in the direction perpendicular to the surface of the substrate, the first channel structures are staggered from the second channel structures, and the first channel structures are isolated from the second channel structures through the second wires. Specifically, please refer to FIGS. 8A-8C, in which FIG. 8A is a schematic top view of the structure of a semiconductor device provided in a third embodiment of the present disclosure; FIG. 8B is a schematic cross-sectional view taken along line A-A of FIG. 8A; FIG. 8C is a schematic cross-sectional view taken along line B-B of FIG. 8A; and FIG. 8D is a schematic cross-sectional view taken along line C-C of FIG. 8A. In the third embodiment of the present disclosure, in the direction perpendicular to the surface of the substrate 10 (the Z direction as shown in FIG. 8B), the first channel structures 120 and the second channel structures 140 are provided in misalignment instead of being set directly, and then electrical isolation between the first channel structures 120 and the second channel structures 140 is achieved through the second wires 130A and 130B.

In the third embodiment, the second wires 130A, 130B have vias, and the second ends 120B of the first channel structures 120 extend into the vias of the second wires 130A, 130B. Furthermore, in order to prevent the gate structure 15 from entering the vias, the vias are filled with isolation layers 21.

Figure 9A:
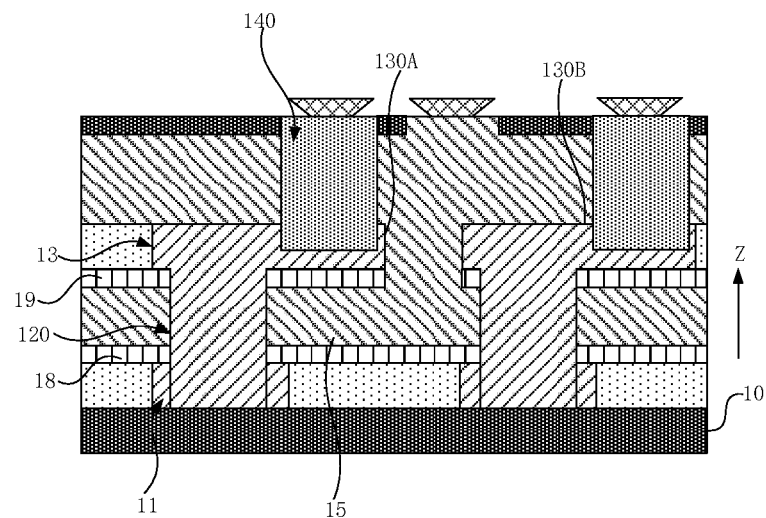
FIG. 9A is a schematic cross-sectional view taken along line A-A of FIG. 8A of a semiconductor device provided in a fourth embodiment of the present disclosure.
Figure 9B:
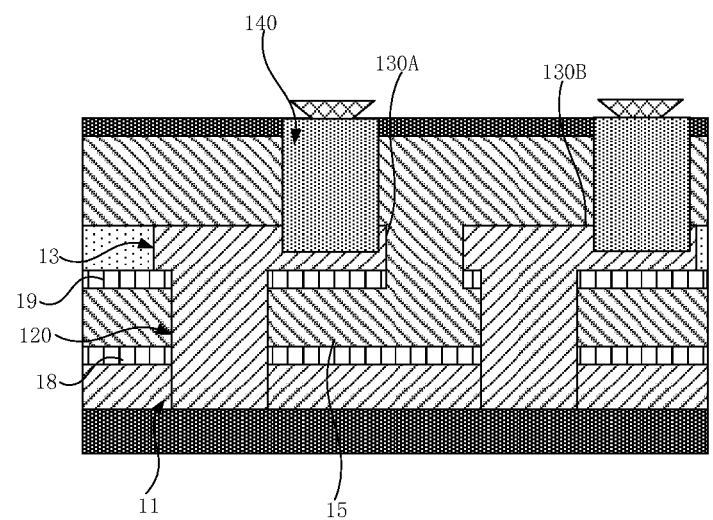
FIG. 9B is a schematic cross-sectional view taken along line B-B of FIG. 8A of the semiconductor device provided in the fourth embodiment of the present disclosure.
Figure 9C:
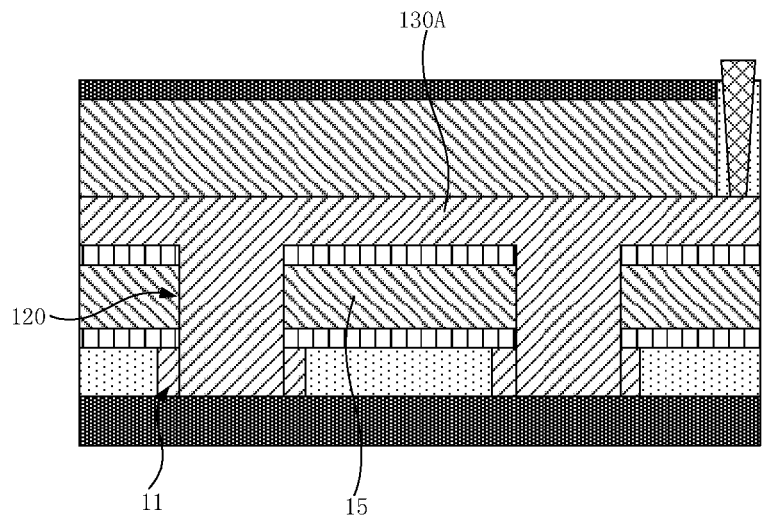
FIG. 9C is a schematic cross-sectional view taken along line C-C of FIG. 8A of the semiconductor device provided in the fourth embodiment of the present disclosure.

A fourth embodiment of the present disclosure further provides a semiconductor device. Please refer to FIGS. 9A-9C, in which please refer to FIG. 8A for a schematic top view of the structure of the semiconductor device provided in the fourth embodiment of the present disclosure; FIG. 9A is a schematic cross-sectional view taken along line A-A of FIG. 8A; FIG. 9B is a schematic cross-sectional view taken along line B-B of FIG. 9A; and FIG. 9C is a schematic cross-sectional view taken along line C-C of FIG. 9A. The fourth embodiment differs from the third embodiment in that: in the fourth embodiment, the semiconductor device further includes a first isolation layer 18 and a second isolation layer 19. The first isolation layer 18 is provided between the first conductive layer 11 and the gate structure 15, and the first channel structures 120 penetrate through the first isolation layer 18. The second isolation layer 19 is provided between the gate structure 15 and the second conductive layer 13, and the first channel structures 120 penetrate through the second isolation layer 19. In the fourth embodiment, each of the first channel structures 120 and each of the second wires are formed together by an epitaxial process, each of the first channel structures 120 are directly connected to each of the second wires 130A, 130B in the epitaxial process, and the second wires 130A and 130B have no vias.

A fifth embodiment of the present disclosure further provides a method for manufacturing a semiconductor device. The semiconductor device includes a conductive layer, the conductive layer includes a plurality of wire pairs, each of the plurality of wire pairs includes two parallel wires, and the two parallel wires have a common end and a non-common end. The conductive layer can be the first conductive layer 11 or the second conductive layer 13 above.

Figure 10:
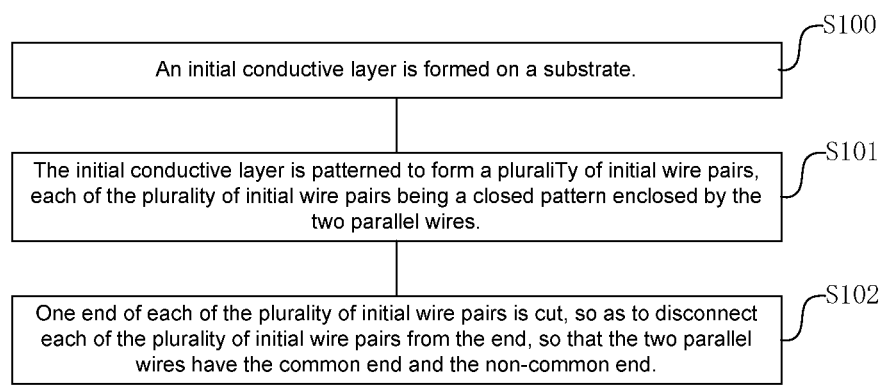
FIG. 10 is a schematic diagram of steps of a method for manufacturing a semiconductor device provided in a fifth embodiment of the present disclosure.
Figure 11A:
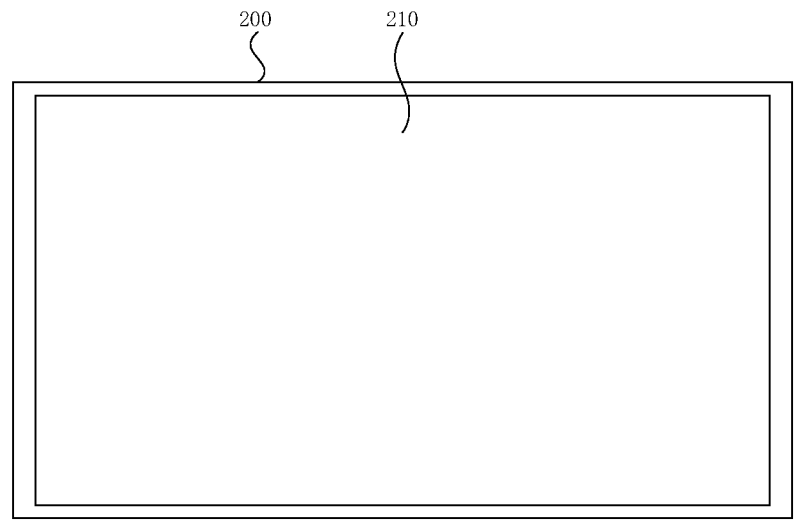
FIGS. 11A-11C are schematic diagrams of the semiconductor device manufactured by the method for manufacturing the semiconductor device provided in the fifth embodiment of the present disclosure.
Figure 11B:
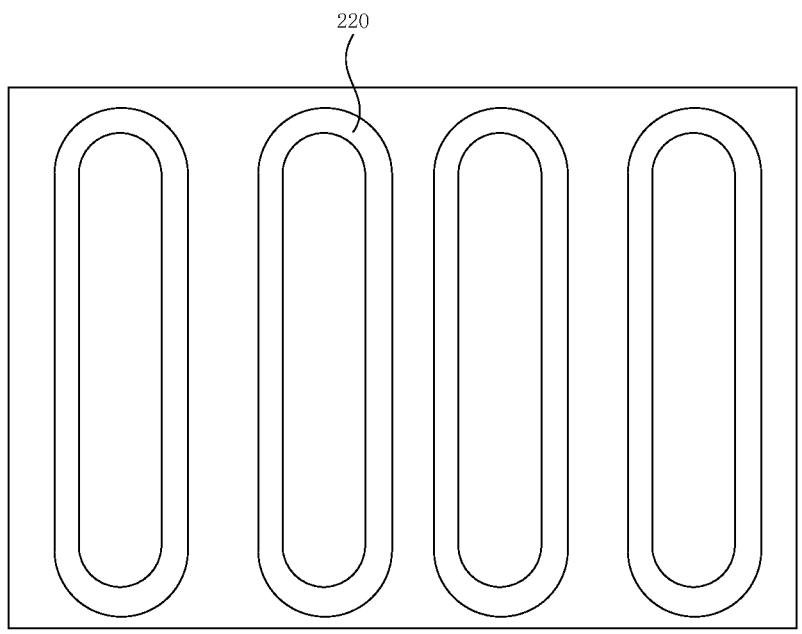
Figure 11C:
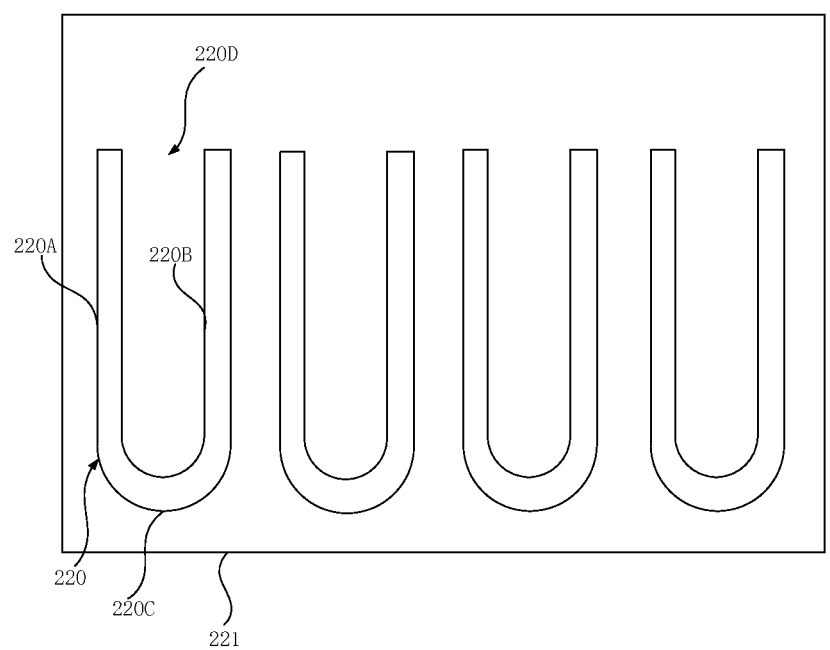

FIG. 10 is a schematic diagram of steps of the method for manufacturing the semiconductor device provided in the fifth embodiment of the present disclosure; and FIGS. 11A-11C are schematic diagrams of a semiconductor device manufactured by the method for manufacturing the semiconductor device provided in the fifth embodiment of the present disclosure. The method for forming the conductive layer includes:

please refer to step S100 and FIG. 11A, an initial conductive layer 210 is formed on a substrate 200.

The substrate 200 can be a semiconductor substrate or a semiconductor substrate provided with devices. Material of the semiconductor substrate can be monocrystalline silicon (Si), monocrystalline germanium (Ge), or silicon germanium (GeSi), silicon carbide (SiC); the material can also be silicon on insulator (SOI), germanium on insulator (GOI); or the material can also be other material, for example, III-V compounds such as gallium arsenide. In this embodiment, the substrate 200 is a semiconductor substrate by monocrystalline silicon (Si) as a material.

The initial conductive layer 210 is made of conductive material, for example, metal material or polysilicon material, and the initial conductive layer 210 can be formed by processes such as chemical vapor deposition or physical deposition. In the present specific embodiment the initial conductive layer 210 is a metal layer.

Please refer to Step S101 and FIG. 11B, the initial conductive layer 210 is patterned to form a plurality of initial wire pairs 220, each of the plurality of initial wire pairs 220 being a closed pattern enclosed by the two parallel wires 220A, 220B. In this step, the plurality of initial wire pairs 220 can be formed by a method of photolithography and etching, and the initial wire pairs 220 can be arranged in sequence in one direction. For example, in FIG. 11B, the plurality of initial wire pairs 220 are sequentially arranged in an X direction. Only four initial wire pairs 220 are schematically drawn in FIG. 11B. It can be understood that the semiconductor device can include more than four initial wire pairs 220.

The initial conductive layer 210 can be a composite structure of a conductive layer and an insulation layer. For example, in some embodiments, the initial conductive layer 210 includes an insulation layer located on the substrate and a conductive layer located on the insulation layer, and thus the plurality of initial wire pairs 220 formed after patterning the initial conductive layer 210 are also composite structures of the insulation layer and the conductive layer. However, in some other embodiments of the present disclosure, the initial conductive layer 210 includes a lower insulation layer located on the substrate, a conductive layer located on the lower insulation layer and an upper insulation layer located on the conductive layer, and thus the plurality of initial wire pairs 220 formed after patterning the initial conductive layer 210 are also composite structures formed by the lower insulation layer, the conductive layer and the upper insulation layer.

Please refer to Step S102 and FIG. 11C, one end of each of the plurality of initial wire pairs 220 is cut, so as to disconnect each of the plurality of initial wire pairs from the end, so that the two parallel wires 220A and 220B have the common end 220C and the non-common end 220D, so as to form the plurality of wire pairs.

In this step, only one end of each of the initial wire pairs 220 is cut, so as to form the non-common end 220D; and the other end is not cut, so that the other end remains connected, so as to form the common end 220C. This processing method not only can increase process window of a subsequent process, but also can omit one connecting wire, providing convenience for wire connecting processes of subsequent sections.

Common ends of the plurality of wire pairs can be located on a same side of the substrate 200, and can also be located on different sides of the substrate 200. For the specific arrangement, reference can be made to FIGS. 2A-2C, and details will not be repeated herein.

In some embodiments, a dielectric layer 221 can be used to fill gaps between wires so as to support the plurality of wire pairs.

The described method for forming the conductive layer can be used for manufacturing the first conductive layer 11 or the second conductive layer 13.

Figure 12:
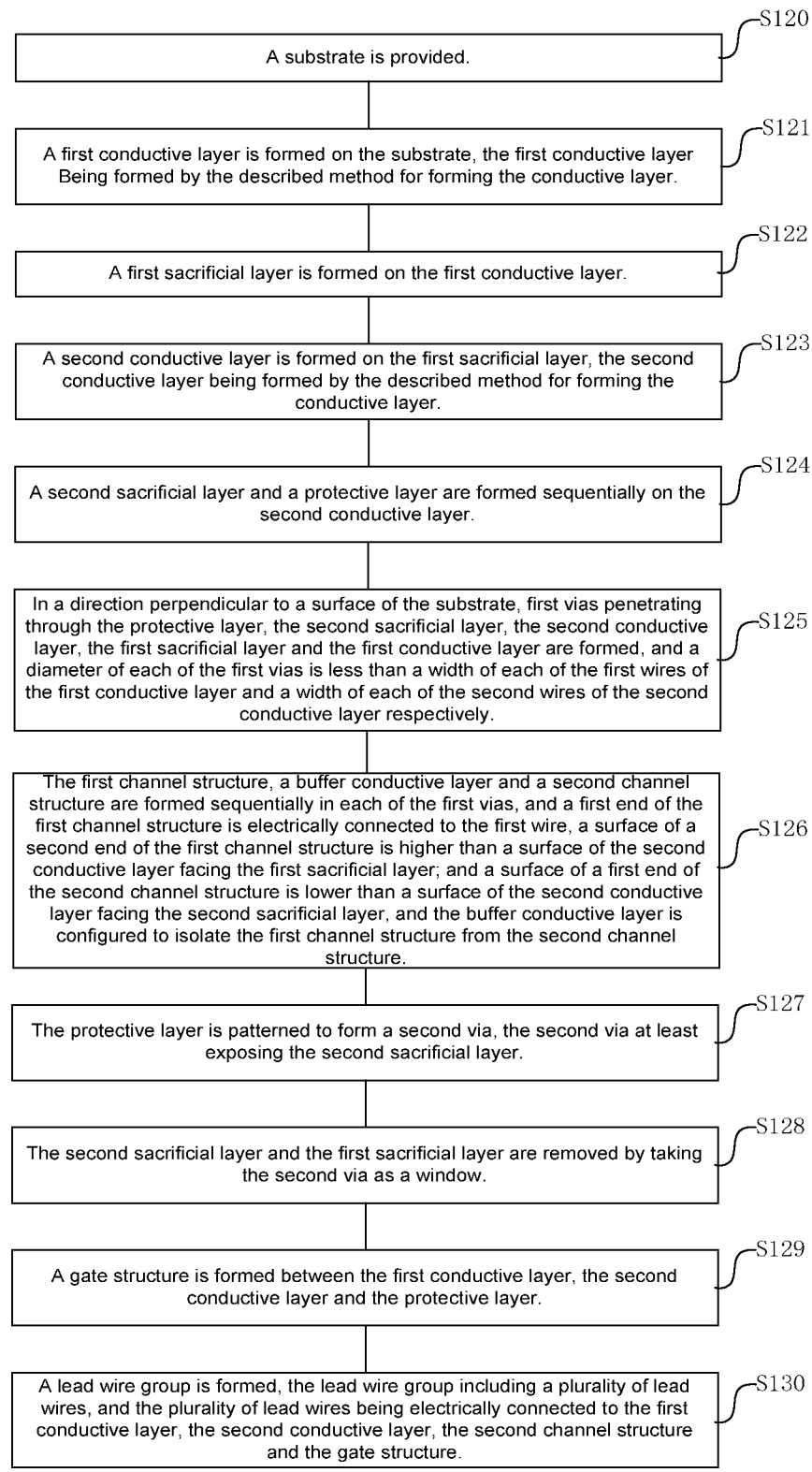
FIG. 12 is a schematic diagram of steps of a method for manufacturing a semiconductor device provided in a sixth embodiment of the present disclosure.
Figure 13A:
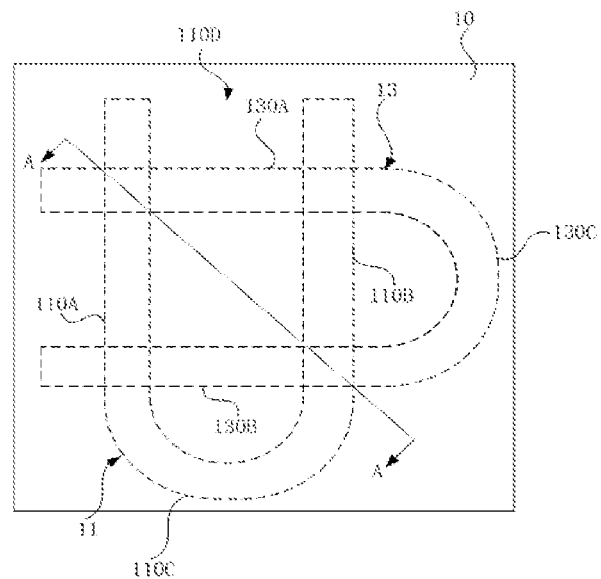
FIGS. 13A-13D are schematic diagrams of the semiconductor device manufactured by the method for manufacturing the semiconductor device provided in the sixth embodiment of the present disclosure.
Figure 13B:
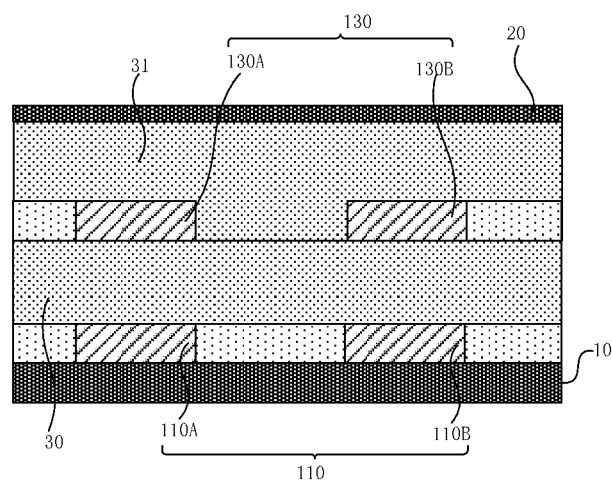

A sixth embodiment of the present disclosure further provides a method for manufacturing a semiconductor device. The method can be used for manufacturing the semiconductor device provided in the first embodiment of the present disclosure. FIG. 12 is a schematic diagram of steps of the method for manufacturing the semiconductor device provided in the sixth embodiment of the present disclosure; and FIGS. 13A-13D are schematic diagrams of the semiconductor device manufactured by the method for manufacturing the semiconductor device provided in the sixth embodiment of the present disclosure. The method for manufacturing the semiconductor device includes:

please refer to FIGS. 12, 13A and 13B, in which FIG. 13A is a top view; and FIG. 13B is a schematic cross-sectional view taken along line A-A of FIG. 13A.

Step S120: a substrate 10 is provided.

Step S121, a first conductive layer 11 is formed on the substrate 10, the first conductive layer 11 being formed by the described method for forming the conductive layer. The first conductive layer 11 has a plurality of first wire pairs 110, each of the plurality of wire pairs including two parallel first wires 110A, 110B, and the two parallel first wires 110A, 110B having a common end 110C and a non-common end 110D.

Step S122: a first sacrificial layer 30 is formed on the first conductive layer 11.

Step S123: a second conductive layer 13 is formed on the first sacrificial layer 30, the second conductive layer 13 being formed by the described method for forming the conductive layer. The second conductive layer 13 includes a plurality of second wire pairs 130, each of the plurality of second wire pairs 130 including two parallel second wires 130A and 130B, and the two parallel second wires 130A and 130B having a common end 130C and a non-common end 130D.

Step S124: a second sacrificial layer 31 and a protective layer 20 are formed sequentially on the second conductive layer 13.

Figure 13C:
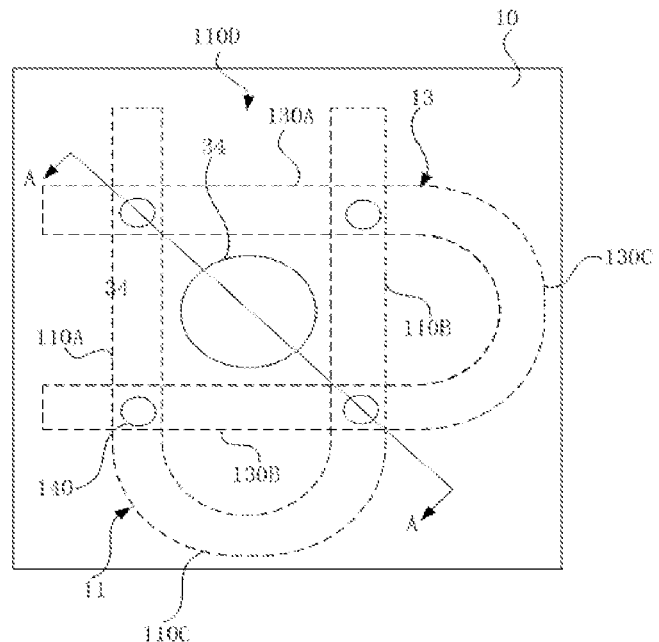
Figure 13D:
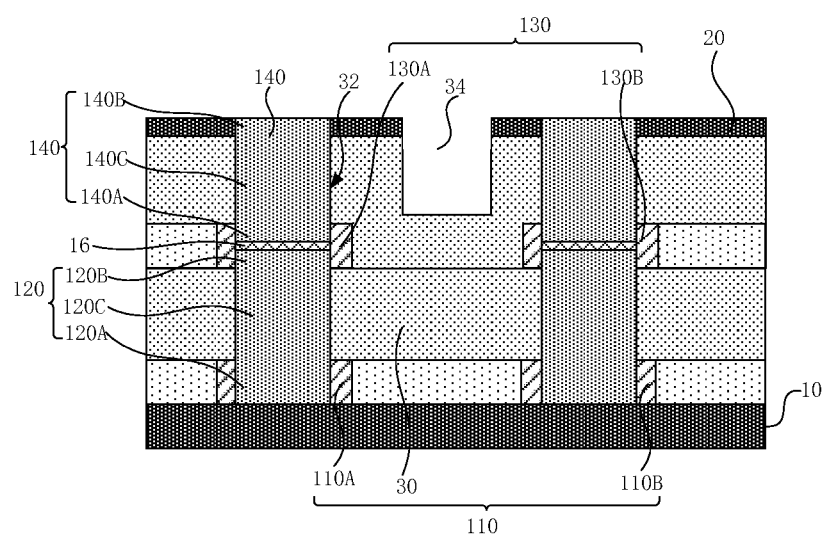

Please refer to FIGS. 1A-1D, 13C and 13D, in which FIG. 13C is a top view; and FIG. 13D is a schematic cross-sectional view taken along line A-A of FIG. 13C.

Step S125, in a direction perpendicular to a surface of the substrate 10, first vias 32 penetrating through the protective layer 20, the second sacrificial layer 31, the second conductive layer 13, the first sacrificial layer 30 and the first conductive layer 11 are formed, and a diameter of each of the first vias 32 is less than a width of each of the first wires of the first conductive layer 11 and a width of each of the second wires of the second conductive layer 13 respectively, so as to facilitate electrical connection between subsequently formed first channel structures, and the first wires and the second wires.

Step S126, the first channel structure 120, a buffer conductive layer 16 and a second channel structure 140 are formed sequentially in each of the first vias 32, and a first end 120A of the first channel structure 120 is electrically connected to each of the first wires 110A and 110B, a surface of a second end 120B of the first channel structure 120 is higher than a surface of the second conductive layer 13 facing the first sacrificial layer 30; and a surface of a first end 140A of the second channel structure 140 is lower than a surface of the second conductive layer 13 facing the second sacrificial layer 31, and the buffer conductive layer 16 is configured to isolate the first channel structure 120 from the second channel structure 140.

In this step, the first channel structure 120 can be formed in each of the first vias by an in-situ doping process or a deposition-followed-by-doping process. After the first channel structure 120 is formed, conductive materials are deposited on a surface of the first channel structure 120 to form the buffer conductive layer 16. After the buffer conductive layer 16 is formed, the second channel structure 140 is formed in each of the first vias by an in-situ doping process or a deposition-followed-by-doping process, and an upper surface of a second end 140B of the second channel structure 140 is flush with an upper surface of the protective layer 20.

The first channel structure 120 is a P-type conductive channel, and the second channel structure 140 is a N-type conductive channel; or the first channel structure 120 is a N-type conductive channel, and the second channel structure 140 is a P-type conductive channel.

Step S127, the protective layer 20 is patterned to form a second via 34, the second via 34 at least exposing the second sacrificial layer 31. In this step, the second via 34 is formed in the middle of a region surrounded by the first vias 32. The first sacrificial layer 30 is connected to the second sacrificial layer 31, and thus in this step, the second via 34 can only expose the second sacrificial layer 31, and the second via 34 does not need to be etched to the second conductive layer 13. Likewise, a subsequent step of removing the first sacrificial layer 30 and the second sacrificial layer 31 by wet etching does not affect the second conductive layer 13.

Please refer to FIGS. 12 and 1A-1D,

Step S128, the second sacrificial layer 31 and the first sacrificial layer 30 are removed by taking the second via 34 as a window. In this step, the second sacrificial layer 31 and the first sacrificial layer 30 can be removed by a wet etching process.

Step S129, a gate structure 15 is formed between the first conductive layer 11, the second conductive layer 13 and the protective layer 20. The gate structure 15 includes a gate dielectric layer and a gate conductive layer. In this step, the gate dielectric layer can be deposited first, and then the gate conductive layer is deposited.

Step S130: a lead wire group is formed, the lead wire group including a plurality of lead wires 170, and the lead wires 170 being electrically connected to first wires 110A, 110B, the second wires 130A, 130B, the second channel structure 140 and the gate structure 15. The lead wire group is configured to electrically lead out various structures, so as to be electrically connected to external components.

A seventh embodiment of the present disclosure further provides a method for manufacturing a semiconductor device. The method can be used for manufacturing the semiconductor device provided in the first embodiment of the present disclosure. The seventh embodiment differs from the sixth embodiment in that: sequences of forming the second sacrificial layer 31, the protective layer 20 and the first channel structure 120 are different. In the sixth embodiment, the second sacrificial layer 31 and the protective layer 20 are formed first, and then the first channel structure 120 is formed; while in the seventh embodiment, the first channel structure 120 is formed, first and then the protective layer 20 is formed.

Figure 14:
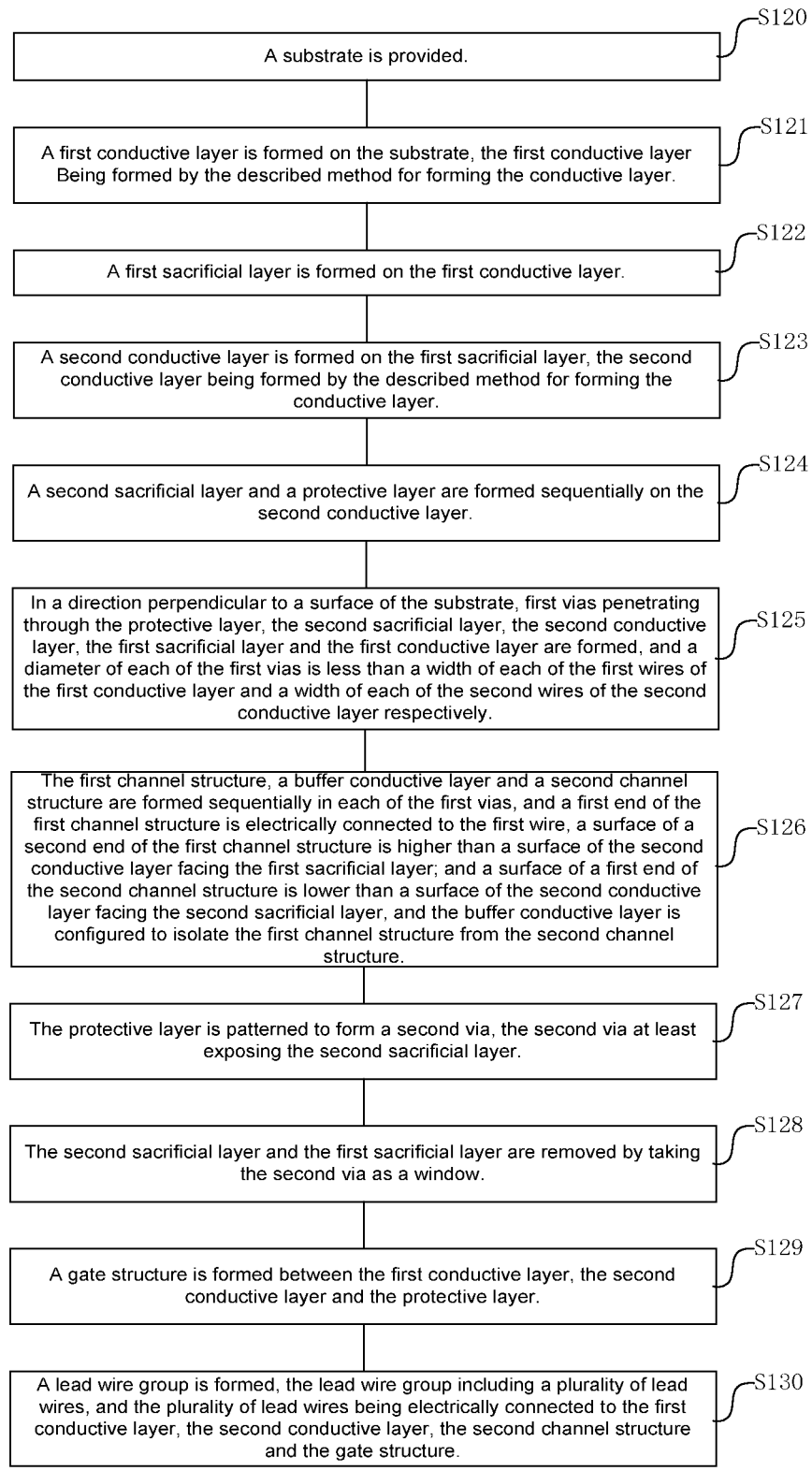
FIG. 14 is a schematic diagram of steps of a method for manufacturing a semiconductor device provided in a seventh embodiment of the present disclosure.
Figure 15A:
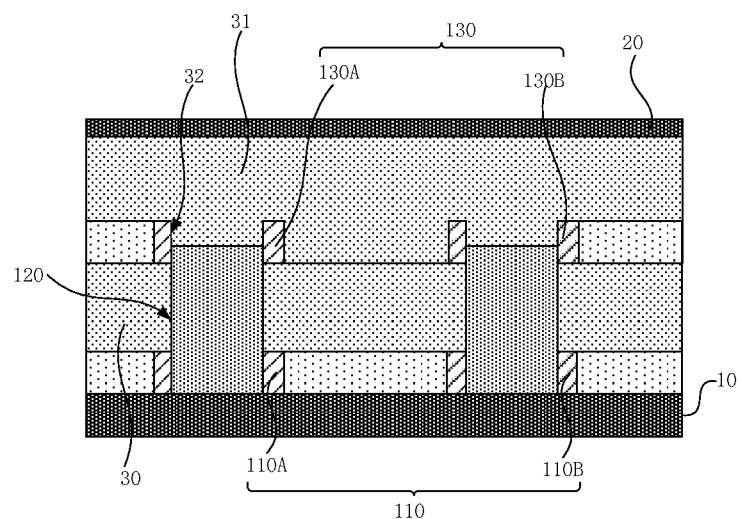
FIGS. 15A-15B are schematic diagrams of the semiconductor device manufactured by the method for manufacturing the semiconductor device provided in the seventh embodiment of the present disclosure.
Figure 15B:
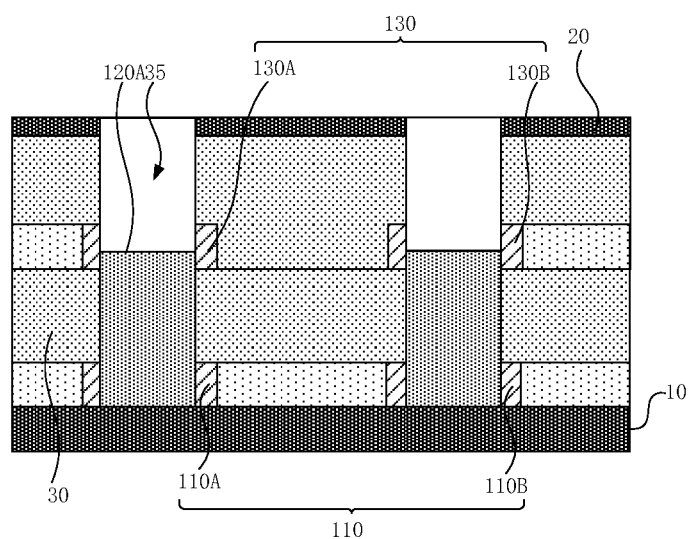

FIG. 14 is a schematic diagram of steps of the method for manufacturing the semiconductor device provided in the seventh embodiment of the present disclosure; and FIGS. 15A-15B are schematic diagrams of a semiconductor device manufactured by the method for manufacturing the semiconductor device provided in the seventh embodiment of the present disclosure. The method for manufacturing the semiconductor device includes:

Please refer to FIGS. 14 and 15A, in which please refer to FIG. 13A for a schematic top view of the structure; and FIG. 15A is a schematic cross-sectional view taken along line A-A of FIG. 13A.

Step S140: a substrate 10 is provided.

Step S141, a first conductive layer 11 is formed on the substrate 10, the first conductive layer 11 being formed by the described method for forming the conductive layer.

Step S142: a first sacrificial layer 30 is formed on the first conductive layer 11.

Step S143: a second conductive layer 13 is formed on the first sacrificial layer 30, the second conductive layer 13 being formed by the described method for forming the conductive layer.

Steps S140 to S143 are the same as steps S120 to S123, and will not be repeated herein.

Step S144, in a direction perpendicular to a surface of the substrate 10, first vias 32 penetrating through the second conductive layer 13, the first sacrificial layer 30 and the first conductive layer 11 are formed, and a diameter of each of the first vias 32 is less than a width of each of the wires of the first conductive layer 11 and a width of each of wires of the second conductive layer 12 respectively.

Step S145, a first channel structure 120 is formed in each of the first vias 32, and a first end 120A of the first channel structure 120 is electrically connected to each of first wires 110A and 110B, and a surface of a second end 120B of the first channel structure 120 is higher than a surface of the second conductive layer 13 facing the first sacrificial layer 30. Moreover, in this step, the surface of the second end 120B of the first channel structure 120 is lower than an upper surface of the second conductive layer 13. In this step, the first channel structure 120 can be formed in each of the first vias 32 by an in-situ doping process or a deposition-followed-by-doping process.

Step S146: a second sacrificial layer 31 and a protective layer 20 are formed sequentially, and the second sacrificial layer 31 fills a remaining part of each of the first vias 32 and covers the surface of the second conductive layer 13.

Please refer to FIGS. 14 and 15B,

Step S147, in the direction perpendicular to the surface of the substrate 10, third vias 35 penetrating through the protective layer 20 and the second sacrificial layer 31 are formed, and each of the third vias 35 expose the second end 120B of the first channel structure 120. In this step, the third vias 35 can be formed by a patterned etching process.

Please refer to FIGS. 14 and 13D,

Step S148, a buffer conductive layer 16 and a second channel structure 140 are formed in each of the third vias 35, and a surface of a first end 140A of the second channel structure 140 is lower than a surface of the second conductive layer 13 facing the second sacrificial layer 31, and the buffer conductive layer 16 is configured to isolate the first channel structure 120 from the second channel structure 140. After forming the buffer conductive layer 16, the second channel structure 140 is formed in each of the third vias 35 by an in-situ doping process or a deposition-followed-by-doping process, and an upper surface of the second end 140B of the second channel structure 140 is flush with an upper surface of the protective layer 20.

Step S149, the protective layer 20 is patterned to form a second via 34, the second via 34 at least exposing the second sacrificial layer 31.

Please refer to FIGS. 14 and 1A-1D,

Step S150, the second sacrificial layer 31 and the first sacrificial layer 30 are removed by taking the second via 34 as a window.

Step S151, a gate structure 15 is formed between the first conductive layer 11, the second conductive layer 13 and the protective layer 20.

Step S152: a lead wire group is formed, the lead wire group including a plurality of lead wires 170, and the lead wires 170 being electrically connected to the first wires 110A, 110B, the second wires 130A, 130B, the second channel structure 140 and the gate structure 15. The lead wire group is configured to electrically lead out various structures, so as to be electrically connected to external components.

Steps S149 to S152 are the same as steps S127 to S130 as shown in FIG. 13, and will not be repeated herein.

An eighth embodiment of the present disclosure further provides a method for manufacturing a semiconductor device. The method can be used for manufacturing the semiconductor device provided in the second embodiment the present disclosure. The eighth embodiment differs from the seventh embodiment in that: in the eighth embodiment, the first channel structure 120 and the second conductive layer 13 are formed by a one-step epitaxial process.

Figure 16A:
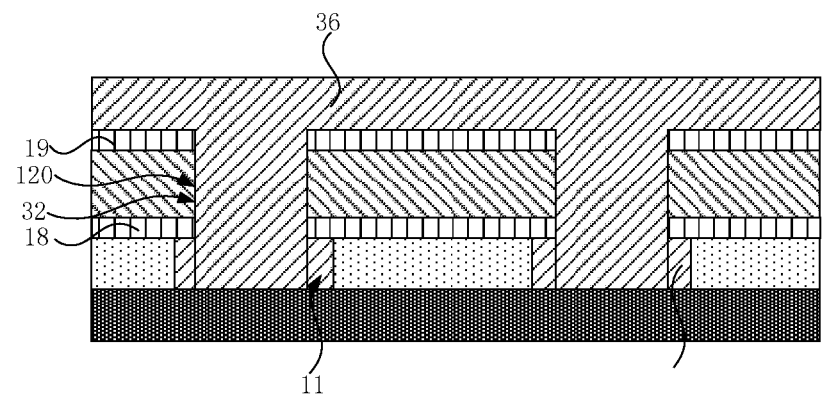
FIGS. 16A-16B are schematic diagrams of a semiconductor device manufactured by a method for manufacturing the semiconductor device provided in an eighth embodiment of the present disclosure.
Figure 16B:
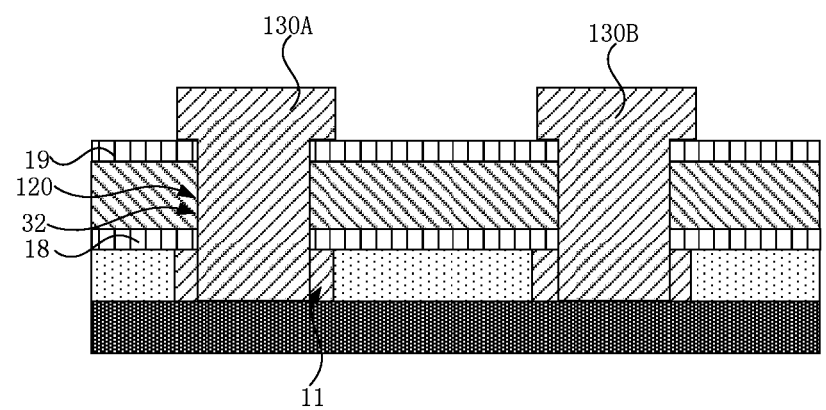

Specifically, after step S141, the following steps are performed:

a first isolation layer 18, a first sacrificial layer 30 and a second isolation layer 19 are formed sequentially on the first conductive layer 11; in a direction perpendicular to a surface of the substrate 10, first vias 32 penetrating through the second isolation layer 19, the first sacrificial layer 30, the first isolation layer 18 and the first conductive layer 11 are formed, and the first vias 32 expose the first conductive layer 11, and a diameter of each of the first vias 32 is less than a width of each of first wires 110A and 110B of the first conductive layer 11;

an epitaxial layer 36 is epitaxially grown in the first vias 32, the epitaxial layer 36 filling each of the first vias 32 to serve as a first channel structure 120, and the epitaxial layer 36 covering the second isolation layer 19, please refer to FIG. 16A; and the epitaxial layer 36 is processed on a surface of the second isolation layer 19 by the described method for forming the conductive layer, so as to form a second conductive layer 13, and a width of each of the second wires of the second conductive layer 13 is greater than a width of the first channel structure 120, please refer to FIG. 16B.

Steps S146 to S152 are performed to form the semiconductor device as shown in FIGS. 7A-7C.

A ninth embodiment of the present disclosure further provides a method for manufacturing a semiconductor device. The method can be used for manufacturing the semiconductor device provided in the third embodiment of the present disclosure. The ninth embodiment differs from the seventh embodiment in that: corresponding relationship between the first channel structure 120 and the second channel structure 140 is different. In the seventh embodiment, the first channel structure 120 and the second channel structure 140 are stacked in a vertical direction; while in the ninth embodiment, the second channel structure 140 is staggered from the first channel structure 120.

Figure 17:
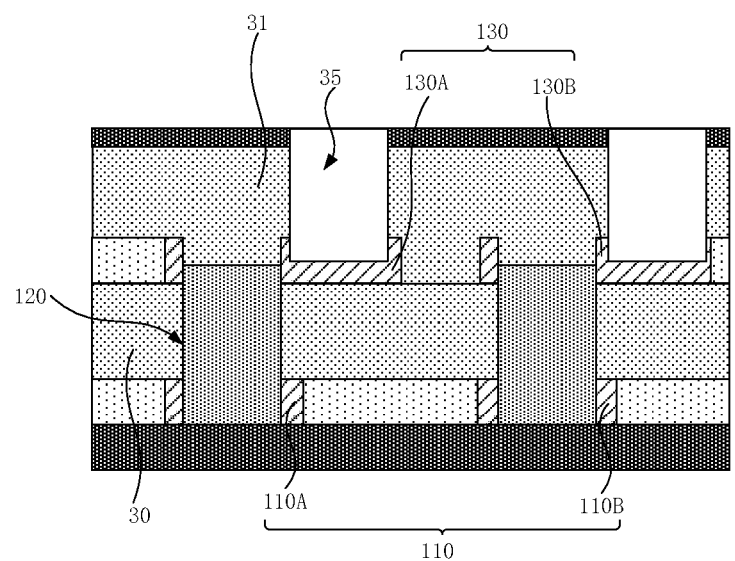
FIG. 17 is a schematic diagram of a semiconductor device manufactured by a method for manufacturing the semiconductor device provided in a ninth embodiment of the present disclosure.

Specifically, the ninth embodiment differs from the seventh embodiment in that: in the step of third vias are formed 35 in step S147 of the seventh embodiment, the third vias 35 formed in the ninth embodiment are offset relative to the first vias 32, and the third vias 35 expose the second wires 130A and 130B, please refer to FIG. 17. In the ninth embodiment, as each of the third vias 35 is offset relative to each of the first vias 32, the first channel structure 120 and the second channel structure 140 formed in each of the third vias 35 do not correspond to each other in the vertical direction, but are provided in a staggered manner, and therefore, the first channel structure 120 and the second channel structure 140 are directly isolated by each of the second wires 130A and 130B without being isolated by buffer conductive layers, please refer to FIG. 8B.

A tenth embodiment of the present disclosure further provides a method for manufacturing a semiconductor device. The method can be used for manufacturing the semiconductor device provided in the fourth embodiment of the present disclosure. The tenth embodiment differs from the eighth embodiment in that: corresponding relationship between the first channel structure 120 and the second channel structure 140 is different. In the eighth embodiment, the first channel structure 120 and the second channel structure 140 are stacked in a vertical direction; while in the tenth embodiment, the second channel structure 140 is staggered from the first channel structure 120.

Figure 18:
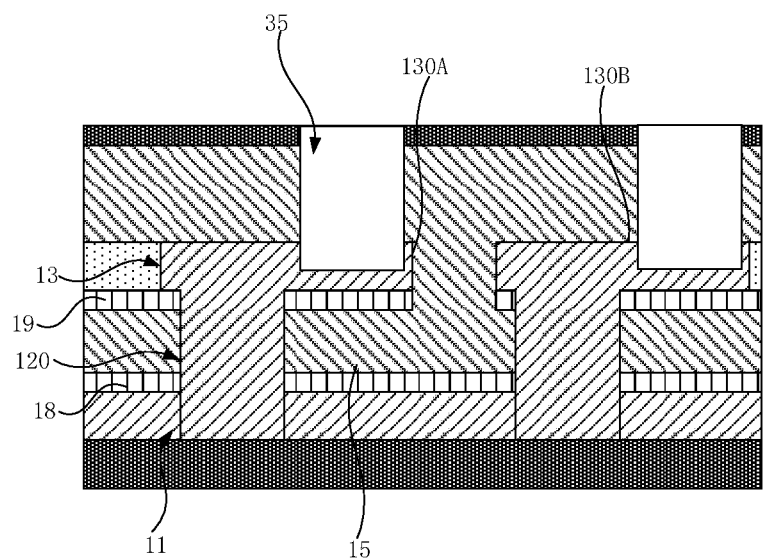
FIG. 18 is a schematic diagram of a semiconductor device manufactured by a method for manufacturing the semiconductor device provided in a tenth embodiment of the present disclosure.

Specifically, the tenth embodiment differs from the eighth embodiment in that: in the step of the third vias 35 are formed in the eighth embodiment, the third vias 35 formed in the tenth embodiment are offset relative to the first vias 32, and the third vias 35 expose the second wires 130A and 130B, please refer to FIG. 18. In the tenth embodiment, as each of the third vias 35 is offset relative to each of the first vias 32, the first channel structure 120 and the second channel structure 140 formed in each of the third vias 35 do not correspond to each other in the vertical direction, but are provided in a staggered manner, and therefore, the first channel structure 120 and the second channel structure 140 are directly isolated by each of the second wires 130A and 130B without being isolated by buffer conductive layers, please refer to FIG. 9B.

The method for manufacturing the semiconductor device in some embodiments of the present disclosure can form a first conductive layer and a second conductive layer having at least a common end. This method not only can increase process window of a subsequent process, but also can omit one connecting wire, providing convenience for wire connecting processes of subsequent sections.

The description above only relates to some embodiments of the present disclosure. It should be noted that for a person of ordinary skill in the present technical field, several improvements and modifications can also be made without departing from the principle of some embodiments of the present disclosure, and these improvements and modifications shall also be considered as within the scope of protection of some embodiments of the present disclosure.

What is claimed is:

1. A semiconductor device, comprising:
   a substrate;
   a first conductive layer, provided on a surface of the substrate, the first conductive layer comprising a plurality of first wire pairs, each of the plurality of first wire pairs comprising two parallel first wires, and the two parallel first wires having a common end and a non-common end;
   a first field effect transistor, provided on the first conductive layer and having first channel structures, the first channel structures extending in a direction perpendicular to the surface of the substrate, and a first end of each of the first channel structures being electrically connected to the first wire;
   a second conductive layer, provided on the first field effect transistor, the second conductive layer comprising a plurality of second wire pairs, each of the plurality of second wire pairs comprising two parallel second wires, and the two parallel second wires having a common end and a non-common end;
   a second field effect transistor, provided on the second conductive layer and having second channel structures, the second channel structures extending in the direction perpendicular to the surface of the substrate, wherein a first end of each of the second channel structures and a second end of each of the first channel structures are electrically connected to the second wire respectively; and
   a gate structure, surrounding sides of the first channel structures and sides of the second channel structures, and the first field effect transistor and the second field effect transistor sharing the gate structure.

2. The semiconductor device according to claim 1, wherein in the first conductive layer, the common end and the non-common end of the plurality of first wire pairs are alternately provided in a direction perpendicular to a direction of a length of the first wire.

3. The semiconductor device according to claim 1, wherein in the second conductive layer, the common end and the non-common end of the plurality of second wire pairs are alternately provided in a direction perpendicular to a direction of a length of the second wire.

4. The semiconductor device according to claim 1, wherein each of the plurality of first wire pairs is formed by cutting one end of a closed pattern enclosed by the two parallel first wires.

5. The semiconductor device according to claim 1, wherein each of the plurality of second wire pairs is formed by cutting one end of a closed pattern enclosed by the two parallel second wires.

6. The semiconductor device according to claim 1, wherein in the direction perpendicular to the surface of the substrate, a projection of the first wire on the surface of the substrate and a projection of the second wire on the surface of the substrate intersect with one another.

7. The semiconductor device according to claim 1, wherein the first channel structures and the second channel structures are stacked in the direction perpendicular to the surface of the substrate, and the second end of each of the first channel structures extends into the second wire, and the first end of each of the second channel structures extends into the second wire; and in the second wire, a buffer conductive layer is provided between the second end of each of the first channel structures and the first end of each of the second channel structures, so as to isolate the first channel structures from the second channel structures.

8. The semiconductor device according to claim 1, wherein in the direction perpendicular to the surface of the substrate, the first channel structures are staggered from the second channel structures, and the first channel structures are isolated from the second channel structures through the second wires.

9. The semiconductor device according to claim 1, wherein in the direction perpendicular to the surface of the substrate, a projection of the first wire on the surface of the substrate and a projection of the second wire on the surface of the substrate are parallel and have a set displacement.

10. The semiconductor device according to claim 9, wherein in the direction perpendicular to the surface of the substrate, the projection of the first wire on the surface of the substrate and the projection of the second wire on the surface of the substrate at least partially overlap.

11. The semiconductor device according to claim 1, wherein the semiconductor device further comprises a lead wire group, the lead wire group comprises a plurality of lead wires, and the plurality of lead wires are electrically connected to the first wires, the second wires, the second channel structures and the gate structure.

12. The semiconductor device according to claim 1, wherein the semiconductor device further comprises a protective layer, the protective layer is provided on the second field effect transistor.

13. The semiconductor device according to claim 1, wherein the semiconductor device further comprises:
a first isolation layer, provided between the first conductive layer and the gate structure; and
a second isolation layer, provided between the gate structure and the second conductive layer.

14. A method for manufacturing a semiconductor device, the semiconductor device comprising
a substrate;
a first conductive layer, provided on a surface of the substrate, the first conductive layer comprising a plurality of first wire pairs, each of the plurality of first wire pairs comprising two parallel first wires, and the two parallel first wires having a common end and a non-common end;
a first field effect transistor, provided on the first conductive layer and having first channel structures, the first channel structures extending in a direction perpendicular to the surface of the substrate, and a first end of each of the first channel structures being electrically connected to the first wire;
a second conductive layer, provided on the first field effect transistor, the second conductive layer comprising a plurality of second wire pairs, each of the plurality of second wire pairs comprising two parallel second wires, and the two parallel second wires having a common end and a non-common end;
a second field effect transistor, provided on the second conductive layer and having second channel structures, the second channel structures extending in the direction perpendicular to the surface of the substrate, wherein a first end of each of the second channel structures and a second end of each of the first channel structures are electrically connected to the second wire respectively; and
a gate structure, surrounding sides of the first channel structures and sides of the second channel structures, and the first field effect transistor and the second field effect transistor sharing the gate structure;
wherein a method for forming the first conductive layer or the second conductive layer comprises:
forming an initial conductive layer on a substrate;
patterning the initial conductive layer to form a plurality of initial wire pairs, each of the plurality of initial wire pairs being a closed pattern enclosed by the two parallel wires; and
cutting one end of each of the plurality of initial wire pairs, so as to disconnect each of the plurality of initial wire pairs from the end, so that the two parallel wires have the common end and the non-common end.

15. A method for manufacturing a semiconductor device, comprising:
providing a substrate;
forming a first conductive layer on the substrate, the first conductive layer being formed by the method according to claim 14;
forming a first sacrificial layer on the first conductive layer;
forming a second conductive layer on the first sacrificial layer, the second conductive layer being formed by the method according to claim 14;
sequentially forming a second sacrificial layer and a protective layer on the second conductive layer;
in a direction perpendicular to a surface of the substrate, forming first vias penetrating through the protective layer, the second sacrificial layer, the second conductive layer, the first sacrificial layer and the first conductive layer, wherein a diameter of each of the first vias is less than a width of each of wires of the first conductive layer and a width of each of wires of the second conductive layer respectively;
sequentially forming a first channel structure, a buffer conductive layer and a second channel structure in each of the first vias, wherein a first end of the first channel structure is electrically connected to a first wire, a surface of a second end of the first channel structure is higher than a surface of the second conductive layer facing the first sacrificial layer, and a surface of a first end of the second channel structure is lower than a surface of the second conductive layer facing the second sacrificial layer, and the buffer conductive layer is configured to isolate the first channel structure from the second channel structure;
patterning the protective layer, to form a second via, the second via at least exposing the second sacrificial layer;
removing the second sacrificial layer and the first sacrificial layer by taking the second via as a window; and forming a gate structure between the first conductive layer, the second conductive layer and the protective layer.

16. A method for manufacturing a semiconductor device, comprising:
providing a substrate;
forming a first conductive layer on the substrate, the first conductive layer being formed by the method according to claim 14;
forming a first sacrificial layer on the first conductive layer;
forming a second conductive layer on the first sacrificial layer, the second conductive layer being formed by the method according to claim 14;
in a direction perpendicular to a surface of the substrate, forming first vias penetrating through the second conductive layer, the first sacrificial layer and the first conductive layer, wherein a diameter of each of the first vias is less than a width of each of wires of the first conductive layer and a width of each of wires of the second conductive layer respectively
forming a first channel structure in each of the first vias, wherein a first end of the first channel structure is electrically connected to a first wire, a surface of a second end of the first channel structure is higher than a surface of the second conductive layer facing the first sacrificial layer;
sequentially forming a second sacrificial layer and a protective layer, wherein the second sacrificial layer fills a remaining part of each of the first vias and covers the surface of the second conductive layer;
in the direction perpendicular to the surface of the substrate, forming third vias penetrating through the protective layer and the second sacrificial layer, wherein each of the third vias expose the second end of the first channel structure;
forming a buffer conductive layer and a second channel structure in each of the third vias, wherein a surface of a first end of the second channel structure is lower than a surface of the second conductive layer facing the second sacrificial layer, and the buffer conductive layer is configured to isolate the first channel structure from the second channel structure;
patterning the protective layer, to form a second via, the second via at least exposing the second sacrificial layer;
removing the second sacrificial layer and the first sacrificial layer by taking the second via as a window; and
forming a gate structure between the first conductive layer, the second conductive layer and the protective layer.

17. A method for manufacturing a semiconductor device, comprising:
providing a substrate;
forming a first conductive layer on the substrate, the first conductive layer being formed by the method according to claim 14;
forming a first sacrificial layer on the first conductive layer;
forming a second conductive layer on the first sacrificial layer, the second conductive layer being formed by the method according to claim 14;
in a direction perpendicular to a surface of the substrate, forming first vias penetrating through the second conductive layer, the first sacrificial layer and the first conductive layer, wherein a diameter of each of the first vias is less than a width of each of wires of the first conductive layer and a width of each of wires of the second conductive layer respectively;
forming a first channel structure in each of the first vias, wherein a first end of the first channel structure is electrically connected to a first wire, a surface of a second end of the first channel structures is higher than a surface of the second conductive layer facing the first sacrificial layer;
sequentially forming a second sacrificial layer and a protective layer, wherein the second sacrificial layer fills a remaining part of each of the first vias and covers the surface of the second conductive layer;
in the direction perpendicular to the surface of the substrate, forming third vias penetrating through the protective layer and the second sacrificial layer, wherein each of the third vias expose the second conductive layer, and each of the third vias is offset relative to each of the first vias in the direction perpendicular to the surface of the substrate;
forming a second channel structure in each of the third vias, wherein a surface of a first end of the second channel structure is lower than a surface of the second conductive layer facing the second sacrificial layer, and the first channel structure is isolated from the second channel structure through the second conductive layer;
patterning the protective layer, to form a second via, the second via at least exposing the second sacrificial layer;
removing the second sacrificial layer and the first sacrificial layer by taking the second via as a window; and
forming a gate structure between the first conductive layer, the second conductive layer and the protective layer.

18. A method for manufacturing a semiconductor device, comprising:
providing a substrate;
forming a first conductive layer on the substrate, the first conductive layer being formed by the method according to claim 14;
sequentially forming a first isolation layer, a first sacrificial layer and a second isolation layer on the first conductive layer;
in a direction perpendicular to a surface of the substrate, forming first vias penetrating through the second isolation layer, the first sacrificial layer and the first conductive layer, wherein the first vias expose the first conductive layer, and a diameter of each of the first vias is less than a width of each of wires of the first conductive layer;
epitaxially growing an epitaxial layer in the first vias, the epitaxial layer filling each of the first vias so as to serve as a first channel structure, and the epitaxial layer covering the second isolation layer;
processing the epitaxial layer on a surface of the second isolation layer by the method according to claim 14, so as to form a second conductive layer;
epitaxially forming a second sacrificial layer and a protective layer on surfaces of the second conductive layer and the second isolation layer;
in the direction perpendicular to the surface of the substrate, forming third vias penetrating through the protective layer and the second sacrificial layer, wherein each of the third vias expose a second end of the first channel structure;
forming a buffer conductive layer and a second channel structure in each of the third vias, wherein a surface of a first end of the second channel structure is lower than a surface of the second conductive layer facing the second sacrificial layer, and the buffer conductive layer is configured to isolate the first channel structure from the second channel structure;

patterning the protective layer, to form a second via, the second via at least exposing the second sacrificial layer;

removing the second sacrificial layer and the first sacrificial layer by taking the second via as a window; and forming a gate structure between the first conductive layer, the second conductive layer and the protective layer.

19. A method for manufacturing a semiconductor device, comprising:

providing a substrate;

forming a first conductive layer on the substrate, the first conductive layer being formed by the method according to claim 14;

sequentially forming a first isolation layer, a first sacrificial layer and a second isolation layer on the first conductive layer;

in a direction perpendicular to a surface of the substrate, forming first vias penetrating through the second isolation layer, the first sacrificial layer, the first isolation layer and the first conductive layer, wherein the first vias expose the first conductive layer, and a diameter of each of the first vias is less than a width of each of wires of the first conductive layer;

epitaxially growing an epitaxial layer in each of the first vias, the epitaxial layer filling each of the first vias so as to serve as a first channel structure, and the epitaxial layer covering the second isolation layer;

processing the epitaxial layer on a surface of the second isolation layer by the method according to claim 14, so as to form a second conductive layer;

epitaxially forming a second sacrificial layer and a protective layer on surfaces of the second conductive layer and the second isolation layer;

forming third vias penetrating through the protective layer and the second sacrificial layer in the direction perpendicular to the surface of the substrate, wherein the third vias expose the second conductive layer, and each of the third vias is offset relative to each of the first vias in the direction perpendicular to the surface of the substrate;

forming a second channel structure in each of the third vias, wherein a surface of a first end of the second channel structure is lower than a surface of the second conductive layer facing the second sacrificial layer, and the first channel structure is isolated from the second channel structure through the second conductive layer;

forming a second via, the second via penetrating through the protective layer, the second sacrificial layer and the second isolation layer, and at least exposing the first sacrificial layer;

removing the second sacrificial layer and the first sacrificial layer by taking the second via as a window; and forming a gate structure between the first isolation layer, the second isolation layer, the second conductive layer and the protective layer.

20. The method for manufacturing the semiconductor device according to claim 15, the method further comprising:

forming a lead wire group, the lead wire group comprising a plurality of lead wires, and the lead wires being electrically connected to the first conductive layer, the second conductive layer, the second channel structure and the gate structure.

* * * * *